United States Patent
Kim et al.

(10) Patent No.: US 10,749,631 B2
(45) Date of Patent: Aug. 18, 2020

(54) METHOD BY WHICH BASE STATION AND TERMINAL TRANSMIT AND RECEIVE DATA SIGNAL IN WIRELESS COMMUNICATION SYSTEM, AND DEVICE FOR SUPPORTING SAME

(71) Applicant: LG ELECTRONICS INC., Seoul (KR)

(72) Inventors: Kijun Kim, Seoul (KR); Byounghoon Kim, Seoul (KR); Joonkui Ahn, Seoul (KR); Daesung Hwang, Seoul (KR)

(73) Assignee: LG ELECTRONICS INC., Seoul (JP)

( * ) Notice: Subject to any disclaimer, the term of this patent is extended or adjusted under 35 U.S.C. 154(b) by 0 days.

(21) Appl. No.: 16/089,118

(22) PCT Filed: Mar. 29, 2017

(86) PCT No.: PCT/KR2017/003407
§ 371 (c)(1),
(2) Date: Sep. 27, 2018

(87) PCT Pub. No.: WO2017/171396
PCT Pub. Date: Oct. 5, 2017

(65) Prior Publication Data
US 2019/0109672 A1 Apr. 11, 2019

Related U.S. Application Data

(60) Provisional application No. 62/382,250, filed on Aug. 31, 2016, provisional application No. 62/320,625, (Continued)

(51) Int. Cl.
*H04L 1/00* (2006.01)
*H03M 13/11* (2006.01)
(Continued)

(52) U.S. Cl.
CPC ......... *H04L 1/0058* (2013.01); *H03M 13/114* (2013.01); *H03M 13/116* (2013.01);
(Continued)

(58) Field of Classification Search
CPC ....... H04L 1/00; H04L 1/0003; H04L 1/0041; H04L 1/0058; H04L 1/0075; H04L 5/00;
(Continued)

(56) References Cited

U.S. PATENT DOCUMENTS 7,689,892 B2 * 3/2010 Stolpman ........... H03M 13/1148
714/750
8,259,698 B2 * 9/2012 Park ..................... H04L 1/1671
370/345
(Continued)

FOREIGN PATENT DOCUMENTS

WO 2015169361 11/2015

OTHER PUBLICATIONS

PCT International Application No. PCT/KR2017/003407, Written Opinion of the International Searching Authority dated Jun. 27, 2017, 25 pages.

*Primary Examiner* — Tri H Phan
(74) *Attorney, Agent, or Firm* — Lee Hong Degerman Kang Waimey

(57) ABSTRACT

Disclosed are a method by which a base station and a terminal transmit and receive a data signal, and a device for supporting the same. More specifically, disclosed are: a method for efficiently transmitting and receiving a corresponding data signal between a base station and a terminal by using a coding scheme determined on the basis of various conditions for the transmitted data signal; and devices for supporting the same.

13 Claims, 10 Drawing Sheets

Related U.S. Application Data filed on Apr. 11, 2016, provisional application No. 62/314,972, filed on Mar. 29, 2016.

(51) Int. Cl.
  *H04L 5/00* (2006.01)
  *H04W 72/04* (2009.01)
  *H03M 13/35* (2006.01)
  *H03M 13/29* (2006.01)
  *H04L 5/14* (2006.01)

(52) U.S. Cl.
  CPC ....... *H03M 13/2957* (2013.01); *H03M 13/35* (2013.01); *H04L 1/00* (2013.01); *H04L 1/0003* (2013.01); *H04L 1/0041* (2013.01); *H04L 1/0075* (2013.01); *H04L 5/001* (2013.01); *H04L 5/0064* (2013.01); *H04L 5/0091* (2013.01); *H04W 72/042* (2013.01); *H04L 5/0023* (2013.01); *H04L 5/14* (2013.01)

(58) Field of Classification Search
  CPC ..... H04L 5/001; H04L 5/0023; H04L 5/0064; H04L 5/0091; H04L 5/14; H03M 13/11; H03M 13/35; H03M 13/114; H03M 13/116; H03M 13/2957; H04W 72/04; H04W 72/042

See application file for complete search history.

(56) References Cited

U.S. PATENT DOCUMENTS

| | | | |
|---|---|---|---|
| 8,751,906 B2 * | 6/2014 | Yeo | ..................... G06F 11/1048 714/752 |
| 9,426,792 B2 * | 8/2016 | Jang | ........................ H04J 13/22 |
| 10,075,266 B2 * | 9/2018 | Luo | ........................ H04L 1/0089 |
| 10,609,702 B2 * | 3/2020 | Tomeba | ................ H04L 5/0044 |
| 2006/0227778 A1 | 10/2006 | Jin et al. | |
| 2007/0248179 A1 | 10/2007 | Hassan et al. | |
| 2008/0168332 A1 | 7/2008 | Palanki et al. | |
| 2016/0007350 A1 | 1/2016 | Xiong et al. | |
| 2017/0026976 A1 * | 1/2017 | Yoo | ........................ H04L 1/0057 |
| 2019/0260501 A1 * | 8/2019 | Kim | ........................ H04L 1/00 |
| 2019/0327037 A1 * | 10/2019 | Yoshimoto | ............. H04L 27/26 |
| 2019/0394009 A1 * | 12/2019 | Yoshimoto | ............ H04W 28/04 |

* cited by examiner

METHOD BY WHICH BASE STATION AND TERMINAL TRANSMIT AND RECEIVE DATA SIGNAL IN WIRELESS COMMUNICATION SYSTEM, AND DEVICE FOR SUPPORTING SAME

CROSS-REFERENCE TO RELATED APPLICATIONS

This application is the National Stage filing under 35 U.S.C. 371 of International Application No. PCT/KR2017/003407, filed on Mar. 29, 2017, which claims the benefit of U.S. Provisional Application No. 62/314,972, filed on Mar. 29, 2016, 62/320,625, filed on Apr. 11, 2016, and 62/382,250, filed on Aug. 31, 2016, the contents of which are all hereby incorporated by reference herein in their entirety.

TECHNICAL FIELD

The present invention relates to a wireless communication system, and more particularly, to methods for transmitting and receiving data signals between a terminal and a base station in a wireless communication system and devices for supporting the same.

More specifically, the present invention is directed to methods by which a terminal and a base station efficiently transmit and receive a data signal using a coding scheme determined based on one or more predetermined conditions (a component carrier for transmitting the data signal, a physical channel carrying the data signal, a payload size of the data signal, the number of code blocks for the data signal, and a bandwidth size of the data signal) and devices for supporting the same.

BACKGROUND ART

Wireless access systems have been widely deployed to provide various types of communication services such as voice or data. In general, a wireless access system is a multiple access system that supports communication of multiple users by sharing available system resources (a bandwidth, transmission power, etc.) among them. For example, multiple access systems include a Code Division Multiple Access (CDMA) system, a Frequency Division Multiple Access (FDMA) system, a Time Division Multiple Access (TDMA) system, an Orthogonal Frequency Division Multiple Access (OFDMA) system, and a Single Carrier Frequency Division Multiple Access (SC-FDMA) system.

DISCLOSURE OF THE INVENTION

Technical Task

An object of the present invention is to provide methods for efficiently transmitting and receiving data signals between a base station and a user equipment.

In particular, another object of the present invention is to provide methods for enabling a base station and a user equipment to support backward compatibility between the Long Term Evolution (LTE) system and the New RAT (NR) system and transmitting and receiving data therebetween when the two systems coexist.

It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solution

The present invention provides methods by which a base station and a user equipment transmit and receive data signals in a wireless communication system and devices therefor.

In an aspect of the present invention, provided herein is a method for transmitting and receiving data signals to and from a User Equipment (UE) by a Base Station (BS) in a wireless communication system. The method may include: determining a first coding scheme to be applied to a downlink data signal to be transmitted to the UE; transmitting information on the first coding scheme to be applied to the downlink data signal to the UE; and transmitting the downlink data signal, which is encoded using the first coding scheme, to the UE. In this case, the BS may determine either a turbo coding scheme or a Low Density Parity Check (LDPC) coding scheme as the first coding scheme.

In another aspect of the present invention, provided herein is a Base Station (BS) for transmitting and receiving data signals to and from a User Equipment (UE) in a wireless communication system. The BS may include: a transmitter; a receiver; and a processor connected to the transmitter and the receiver. The processor may be configured to: determine a first coding scheme to be applied to a downlink data signal to be transmitted to the UE; transmit information on the first coding scheme to be applied to the downlink data signal to the UE; and transmit the downlink data signal, which is encoded using the first coding scheme, to the UE. In addition, the processor may determine either a turbo coding scheme or a Low Density Parity Check (LDPC) coding scheme as the first coding scheme.

In this case, determining the first coding scheme to be applied to the downlink data signal to be transmitted to the UE may include determining the first coding scheme to be applied to the downlink data signal according to a Component Carrier (CC) on which the downlink data is to be transmitted.

For example, the first coding scheme to be applied to the downlink data signal may be determined based on a comparison result of subcarrier spacing applied to the CC on which the downlink data signal is to be transmitted with a first reference value.

As another example, the first coding scheme to be applied to the downlink data signal is determined based on a comparison result of a transmission bandwidth applied to the CC on which the downlink data signal is to be transmitted with a second reference value.

As a further example, the first coding scheme to be applied to the downlink data signal may be determined based on a transmission band of the CC on which the downlink data signal is to be transmitted.

In addition, determining the first coding scheme to be applied to the downlink data signal to be transmitted to the UE may include determining the first coding scheme to be applied to the downlink data signal according to a data rate of the downlink data signal.

Moreover, determining the first coding scheme to be applied to the downlink data signal to be transmitted to the UE may include determining the first coding scheme to be applied to the downlink data signal according to a coding rate of the downlink data signal.

Further, the information on the first coding scheme to be applied to the downlink data signal may be transmitted through Radio Resource Control (RRC) signaling or Downlink Control Information (DCI).

Additionally, the BS may receive, from the UE, information on channel coding schemes that the UE can support and determine the first coding scheme to be applied to the downlink data signal to be transmitted to the UE by additionally using the information on channel coding schemes that the UE can support.

Additionally, the BS may determine a second coding scheme to be applied to an uplink data signal to be received from the UE; transmit information on the second coding scheme to be applied to the uplink data signal to the UE; receive the uplink data signal, which is encoded using the second coding scheme, from the UE; and decode the uplink data signal using the second coding scheme. In this case, the BS may determine either the turbo coding scheme or the LDPC coding scheme as the second coding scheme.

In a further aspect of the present invention, provided herein is a method for transmitting and receiving data signals to and from a Base Station (BS) by a User Equipment (UE) in a wireless communication system. The method may include: receiving information on a first coding scheme to be applied to a downlink data signal from the BS; receiving the downlink data signal, which is encoded using the first coding scheme, from the BS; and decoding the downlink data signal using the first coding scheme. The first coding scheme may be either a turbo coding scheme or a Low Density Parity Check (LDPC) coding scheme.

In a still further aspect of the present invention, provided herein is a User Equipment (UE) for transmitting and receiving signals to and from a Base Station (BS) in a wireless communication system. The UE may include: a transmitter; a receiver; and a processor connected to the transmitter and the receiver. The processor may be configured to: receive information on a first coding scheme to be applied to a downlink data signal from the BS; receive the downlink data signal, which is encoded using the first coding scheme, from the BS; and decode the downlink data signal using the first coding scheme. In this case, the first coding scheme may be either a turbo coding scheme or a Low Density Parity Check (LDPC) coding scheme.

In this case, the UE may receive information on a second coding scheme to be applied to an uplink data signal from the BS; and transmit the uplink data signal, which is encoded using the second coding scheme, to the BS. In this case, the second coding scheme may be either the turbo coding scheme or the Low Density Parity Check (LDPC) coding scheme.

It will be appreciated by those skilled in the art that the above-described aspects of the present invention are merely part of the embodiments of the present invention and various modifications and alternatives could be developed from the following technical features of the present invention.

Advantageous Effects

As is apparent from the above description, the embodiments of the present disclosure have the following effects.

According to the present invention, a BS can determine a coding scheme to be applied to a downlink data signal to be transmitted to a UE or an uplink signal to be received from the UE. In this case, a turbo coding scheme, a Low Density Parity Check (LDPC) coding scheme, or the like may be used as the coding scheme.

In addition, according to the present invention, a BS can select either a coding scheme capable supporting high coding gain or a coding scheme capable of supporting low decoding complexity, which will be applied to a downlink data signal or an uplink data signal, based on a data rate, a Modulation and Coding Scheme (MCS) level, etc.

According to the present invention, a base station and a user equipment can efficiently transmit and receive data signals by applying a different coding scheme depending on their communication environments, the importance of data, etc.

The effects that can be achieved through the embodiments of the present invention are not limited to what has been particularly described hereinabove and other effects which are not described herein can be derived by those skilled in the art from the following detailed description. That is, it should be noted that the effects which are not intended by the present invention can be derived by those skilled in the art from the embodiments of the present invention.

DESCRIPTION OF DRAWINGS

The accompanying drawings, which are included to provide a further understanding of the invention, provide embodiments of the present invention together with detail explanation. Yet, a technical characteristic of the present invention is not limited to a specific drawing. Characteristics disclosed in each of the drawings are combined with each other to configure a new embodiment. Reference numerals in each drawing correspond to structural elements.

BEST MODE FOR INVENTION

Figure 1:
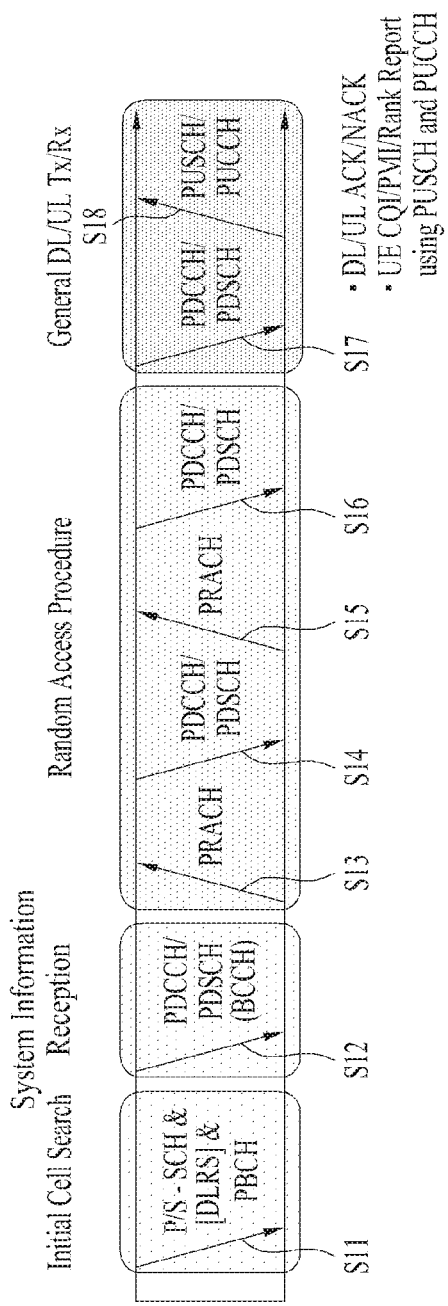
FIG. 1 is a diagram illustrating physical channels and a signal transmission method using the physical channels.

The embodiments of the present disclosure described below are combinations of elements and features of the present disclosure in specific forms. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions or elements of any one embodiment may be included in another embodiment and may be replaced with corresponding constructions or features of another embodiment.

In the description of the attached drawings, a detailed description of known procedures or steps of the present disclosure will be avoided lest it should obscure the subject matter of the present disclosure. In addition, procedures or steps that could be understood to those skilled in the art will not be described either.

Throughout the specification, when a certain portion "includes" or "comprises" a certain component, this indicates that other components are not excluded and may be further included unless otherwise noted. The terms "unit", "-or/er" and "module" described in the specification indicate a unit for processing at least one function or operation, which may be implemented by hardware, software or a combination thereof. In addition, the terms "a or an", "one", "the" etc. may include a singular representation and a plural representation in the context of the present disclosure (more particularly, in the context of the following claims) unless indicated otherwise in the specification or unless context clearly indicates otherwise.

In the embodiments of the present disclosure, a description is mainly made of a data transmission and reception relationship between a Base Station (BS) and a User Equipment (UE). A BS refers to a terminal node of a network, which directly communicates with a UE. A specific operation described as being performed by the BS may be performed by an upper node of the BS.

Namely, it is apparent that, in a network comprised of a plurality of network nodes including a BS, various operations performed for communication with a UE may be performed by the BS, or network nodes other than the BS. The term 'BS' may be replaced with a fixed station, a Node B, an evolved Node B (eNode B or eNB), an Advanced Base Station (ABS), an access point, etc.

In the embodiments of the present disclosure, the term terminal may be replaced with a UE, a Mobile Station (MS), a Subscriber Station (SS), a Mobile Subscriber Station (MSS), a mobile terminal, an Advanced Mobile Station (AMS), etc.

A transmission end is a fixed and/or mobile node that provides a data service or a voice service and a reception end is a fixed and/or mobile node that receives a data service or a voice service. Therefore, a UE may serve as a transmission end and a BS may serve as a reception end, on an UpLink (UL). Likewise, the UE may serve as a reception end and the BS may serve as a transmission end, on a DownLink (DL).

The embodiments of the present disclosure may be supported by standard specifications disclosed for at least one of wireless access systems including an Institute of Electrical and Electronics Engineers (IEEE) 802.xx system, a 3rd Generation Partnership Project (3GPP) system, a 3GPP Long Term Evolution (LTE) system, and a 3GPP2 system. In particular, the embodiments of the present disclosure may be supported by the standard specifications, 3GPP TS 36.211, 3GPP TS 36.212, 3GPP TS 36.213, 3GPP TS 36.321 and 3GPP TS 36.331. That is, the steps or parts, which are not described to clearly reveal the technical idea of the present disclosure, in the embodiments of the present disclosure may be explained by the above standard specifications. All terms used in the embodiments of the present disclosure may be explained by the standard specifications.

Reference will now be made in detail to the embodiments of the present disclosure with reference to the accompanying drawings. The detailed description, which will be given below with reference to the accompanying drawings, is intended to explain exemplary embodiments of the present disclosure, rather than to show the only embodiments that can be implemented according to the disclosure.

The following detailed description includes specific terms in order to provide a thorough understanding of the present disclosure. However, it will be apparent to those skilled in the art that the specific terms may be replaced with other terms without departing the technical spirit and scope of the present disclosure.

For example, the term, TxOP may be used interchangeably with transmission period or Reserved Resource Period (RRP) in the same sense. Further, a Listen-Before-Talk (LBT) procedure may be performed for the same purpose as a carrier sensing procedure for determining whether a channel state is idle or busy, CCA (Clear Channel Assessment), CAP (Channel Access Procedure).

Hereinafter, 3GPP LTE/LTE-A systems are explained, which are examples of wireless access systems.

The embodiments of the present disclosure can be applied to various wireless access systems such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc.

CDMA may be implemented as a radio technology such as Universal Terrestrial Radio Access (UTRA) or CDMA2000. TDMA may be implemented as a radio technology such as Global System for Mobile communications (GSM)/General packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved UTRA (E-UTRA), etc.

UTRA is a part of Universal Mobile Telecommunications System (UMTS). 3GPP LTE is a part of Evolved UMTS (E-UMTS) using E-UTRA, adopting OFDMA for DL and SC-FDMA for UL. LTE-Advanced (LTE-A) is an evolution of 3GPP LTE. While the embodiments of the present disclosure are described in the context of a 3GPP LTE/LTE-A system in order to clarify the technical features of the present disclosure, the present disclosure is also applicable to an IEEE 802.16e/m system, etc.

1. 3GPP LTE/LTE-A System

In a wireless access system, a UE receives information from an eNB on a DL and transmits information to the eNB on a UL. The information transmitted and received between the UE and the eNB includes general data information and various types of control information. There are many physical channels according to the types/usages of information transmitted and received between the eNB and the UE.

FIG. 1 illustrates physical channels and a general signal transmission method using the physical channels, which may be used in embodiments of the present disclosure.

When a UE is powered on or enters a new cell, the UE performs initial cell search (S11). The initial cell search involves acquisition of synchronization to an eNB. Specifically, the UE synchronizes its timing to the eNB and acquires information such as a cell Identifier (ID) by receiving a Primary Synchronization Channel (P-SCH) and a Secondary Synchronization Channel (S-SCH) from the eNB.

Then the UE may acquire information broadcast in the cell by receiving a Physical Broadcast Channel (PBCH) from the eNB.

During the initial cell search, the UE may monitor a DL channel state by receiving a Downlink Reference Signal (DL RS).

After the initial cell search, the UE may acquire more detailed system information by receiving a Physical Downlink Control Channel (PDCCH) and receiving a Physical Downlink Shared Channel (PDSCH) based on information of the PDCCH (S12).

To complete connection to the eNB, the UE may perform a random access procedure with the eNB (S13 to S16). In the random access procedure, the UE may transmit a preamble on a Physical Random Access Channel (PRACH) (S13) and may receive a PDCCH and a PDSCH associated with the PDCCH (S14). In the case of contention-based random access, the UE may additionally perform a contention resolution procedure including transmission of an additional PRACH (S15) and reception of a PDCCH signal and a PDSCH signal corresponding to the PDCCH signal (S16).

After the above procedure, the UE may receive a PDCCH and/or a PDSCH from the eNB (S17) and transmit a Physical Uplink Shared Channel (PUSCH) and/or a Physical Uplink Control Channel (PUCCH) to the eNB (S18), in a general UL/DL signal transmission procedure.

Control information that the UE transmits to the eNB is generically called Uplink Control Information (UCI). The UCI includes a Hybrid Automatic Repeat and reQuest Acknowledgement/Negative Acknowledgement (HARQ-ACK/NACK), a Scheduling Request (SR), a Channel Quality Indicator (CQI), a Precoding Matrix Index (PMI), a Rank Indicator (RI), etc.

In the LTE system, UCI is generally transmitted on a PUCCH periodically. However, if control information and traffic data should be transmitted simultaneously, the control information and traffic data may be transmitted on a PUSCH. In addition, the UCI may be transmitted aperiodically on the PUSCH, upon receipt of a request/command from a network.

Figure 2:
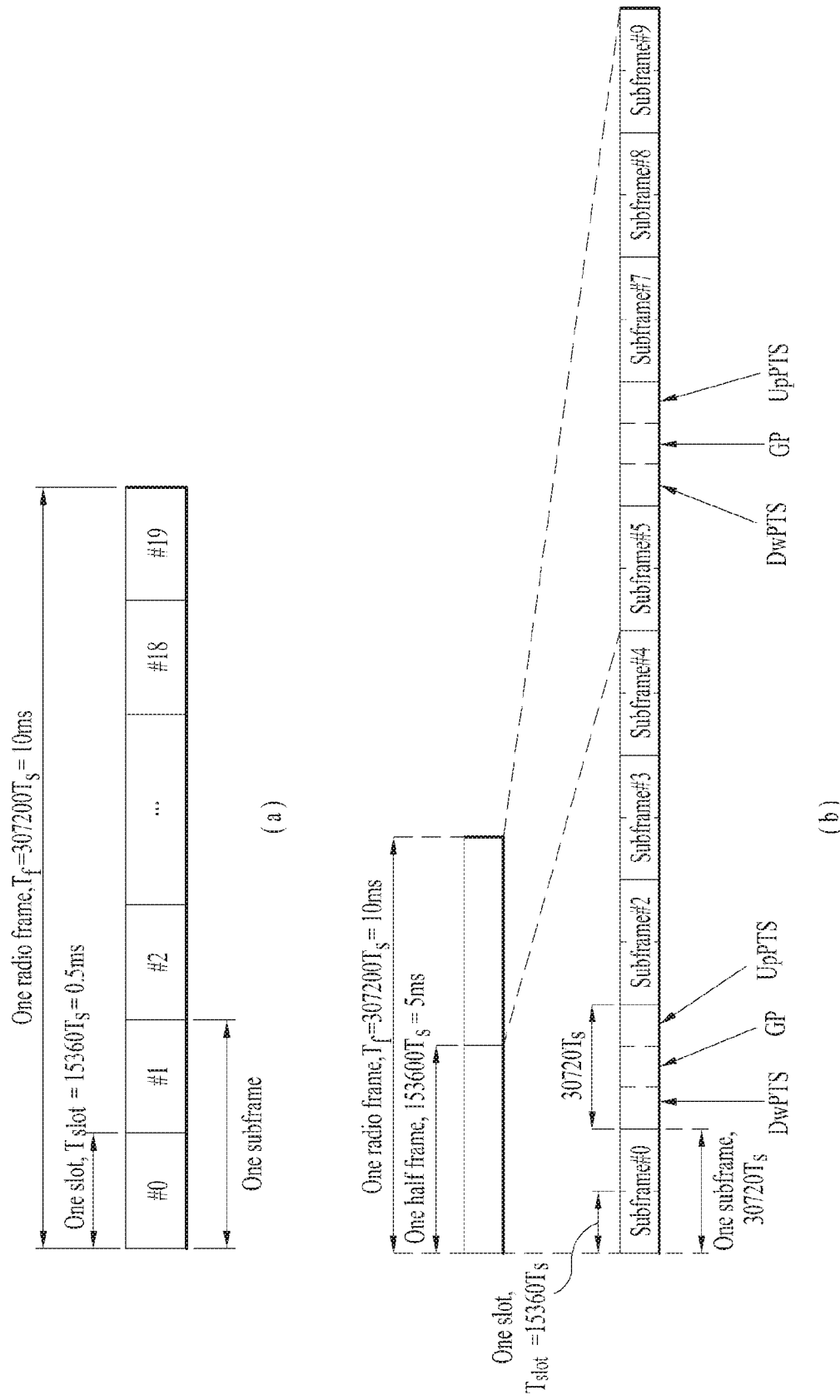
FIG. 2 is a diagram illustrating exemplary radio frame structures.

FIG. 2 illustrates exemplary radio frame structures used in embodiments of the present disclosure.

FIG. 2($a$) illustrates frame structure type 1. Frame structure type 1 is applicable to both a full Frequency Division Duplex (FDD) system and a half FDD system.

bols in the time domain by a plurality of Resource Blocks (RBs) in the frequency domain.

A slot includes a plurality of OFDM symbols in the time domain. Since OFDMA is adopted for DL in the 3GPP LTE system, one OFDM symbol represents one symbol period. An OFDM symbol may be called an SC-FDMA symbol or symbol period. An RB is a resource allocation unit including a plurality of contiguous subcarriers in one slot.

In a full FDD system, each of 10 subframes may be used simultaneously for DL transmission and UL transmission during a 10-ms duration. The DL transmission and the UL transmission are distinguished by frequency. On the other hand, a UE cannot perform transmission and reception simultaneously in a half FDD system.

The above radio frame structure is purely exemplary. Thus, the number of subframes in a radio frame, the number of slots in a subframe, and the number of OFDM symbols in a slot may be changed.

FIG. 2($b$) illustrates frame structure type 2. Frame structure type 2 is applied to a Time Division Duplex (TDD) system. One radio frame is 10 ms ($Tf=307200 \cdot T_s$) long, including two half-frames each having a length of 5 ms ($=153600 \cdot T_s$) long. Each half-frame includes five subframes each being 1 ms ($=30720 \cdot T_s$) long. An ith subframe includes 2ith and (2i+1)th slots each having a length of 0.5 ms ($Tslot=15360 \cdot T_s$). Ts is a sampling time given as $T_s=1/(15 \text{ kHz} \times 2048)=3.2552 \times 10-8$ (about 33 ns).

A type-2 frame includes a special subframe having three fields, Downlink Pilot Time Slot (DwPTS), Guard Period (GP), and Uplink Pilot Time Slot (UpPTS). The DwPTS is used for initial cell search, synchronization, or channel estimation at a UE, and the UpPTS is used for channel estimation and UL transmission synchronization with a UE at an eNB. The GP is used to cancel UL interference between a UL and a DL, caused by the multi-path delay of a DL signal.

[Table 1] below lists special subframe configurations (DwPTS/GP/UpPTS lengths).

TABLE 1

| | Normal cyclic prefix in downlink | | | Extended cyclic prefix in downlink | | |
| | | UpPTS | | | UpPTS | |
| Special subframe configuration | DwPTS | Normal cyclic prefix in uplink | Extended cyclic prefix in uplink | DwPTS | Normal cyclic prefix in uplink | Extended cyclic prefix in uplink |
|---|---|---|---|---|---|---|
| 0 | $6592 \cdot T_s$ | $2192 \cdot T_s$ | $2560 \cdot T_s$ | $7680 \cdot T_s$ | $2192 \cdot T_s$ | $2560 \cdot T_s$ |
| 1 | $19760 \cdot T_s$ | | | $20480 \cdot T_s$ | | |
| 2 | $21952 \cdot T_s$ | | | $23040 \cdot T_s$ | | |
| 3 | $24144 \cdot T_s$ | | | $25600 \cdot T_s$ | | |
| 4 | $26336 \cdot T_s$ | | | $7680 \cdot T_s$ | $4384 \cdot T_s$ | $5120 \cdot T_s$ |
| 5 | $6592 \cdot T_s$ | $4384 \cdot T_s$ | $5120 \cdot T_s$ | $20480 \cdot T_s$ | | |
| 6 | $19760 \cdot T_s$ | | | $23040 \cdot T_s$ | | |
| 7 | $21952 \cdot T_s$ | | | — | — | — |
| 8 | $24144 \cdot T_s$ | | | — | — | — |

One radio frame is 10 ms ($Tf=307200 \cdot T_s$) long, including equal-sized 20 slots indexed from 0 to 19. Each slot is 0.5 ms ($Tslot=15360 \cdot T_s$) long. One subframe includes two successive slots. An ith subframe includes 2ith and (2i+1)th slots. That is, a radio frame includes 10 subframes. A time required for transmitting one subframe is defined as a Transmission Time Interval (TTI). Ts is a sampling time given as $T_s=1/(15 \text{ kHz} \times 2048)=3.2552 \times 10-8$ (about 33 ns). One slot includes a plurality of Orthogonal Frequency Division Multiplexing (OFDM) symbols or SC-FDMA sym- FIG. 3 illustrates an exemplary structure of a DL resource grid for the duration of one DL slot, which may be used in embodiments of the present disclosure.

Figure 3:
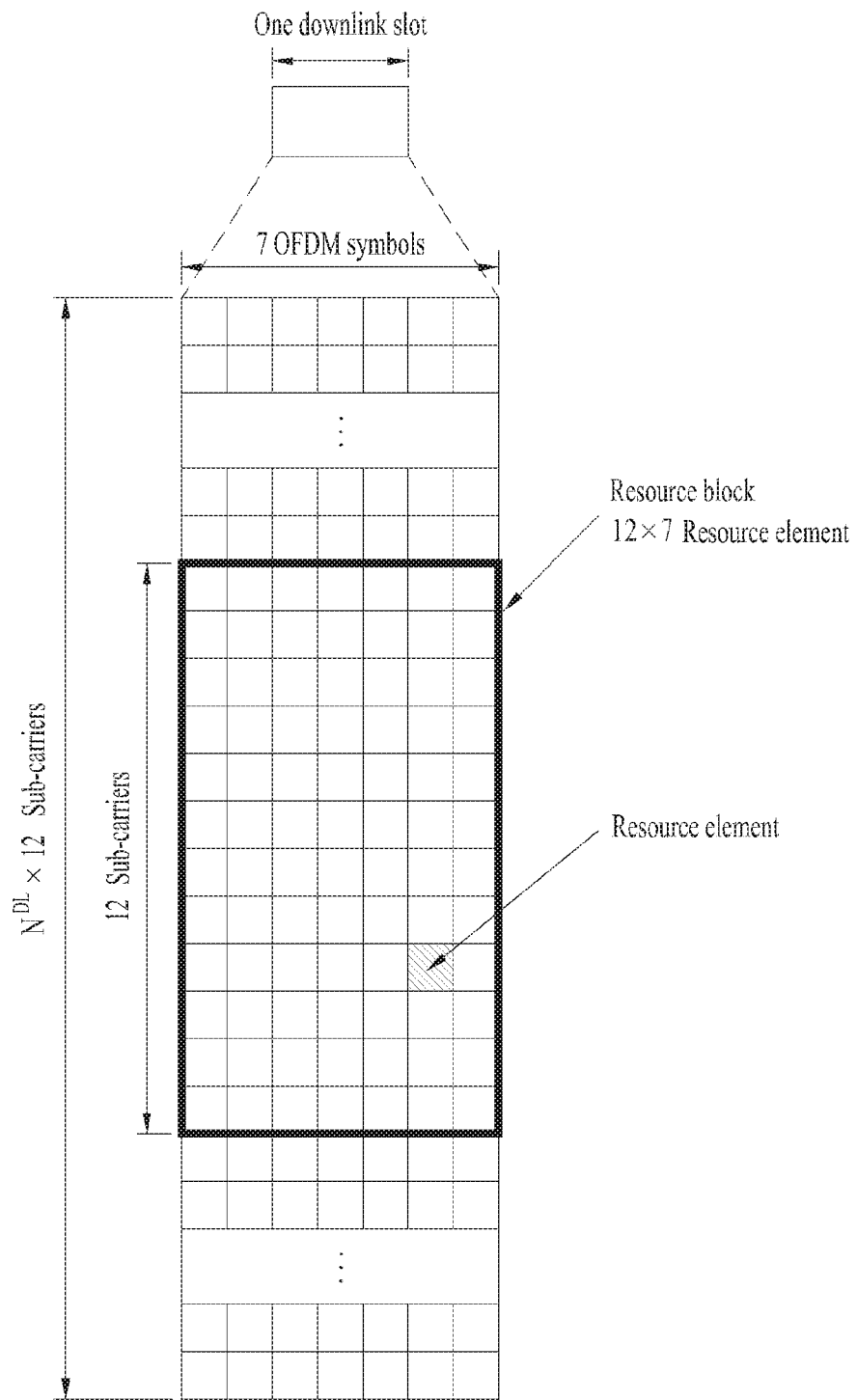
FIG. 3 is a diagram illustrating an exemplary resource grid for the duration of a downlink slot.

Referring to FIG. 3, a DL slot includes a plurality of OFDM symbols in the time domain. One DL slot includes 7 OFDM symbols in the time domain and an RB includes 12 subcarriers in the frequency domain, to which the present disclosure is not limited.

Each element of the resource grid is referred to as a Resource Element (RE). An RB includes 12×7 REs. The number of RBs in a DL slot, NDL depends on a DL transmission bandwidth. The structure of the uplink slot may be the same as the structure of the downlink slot.

Figure 4:
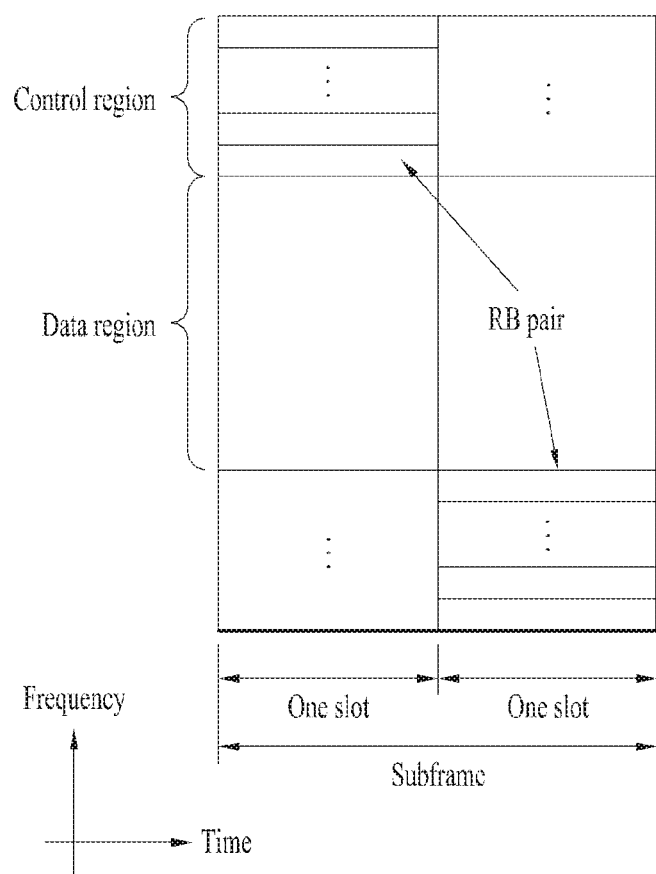
FIG. 4 is a diagram illustrating an exemplary structure of an uplink subframe.

FIG. 4 illustrates a structure of a UL subframe which may be used in embodiments of the present disclosure.

Referring to FIG. 4, a UL subframe may be divided into a control region and a data region in the frequency domain. A PUCCH carrying UCI is allocated to the control region and a PUSCH carrying user data is allocated to the data region. To maintain a single carrier property, a UE does not transmit a PUCCH and a PUSCH simultaneously. A pair of RBs in a subframe are allocated to a PUCCH for a UE. The RBs of the RB pair occupy different subcarriers in two slots. Thus it is said that the RB pair frequency-hops over a slot boundary.

Figure 5:
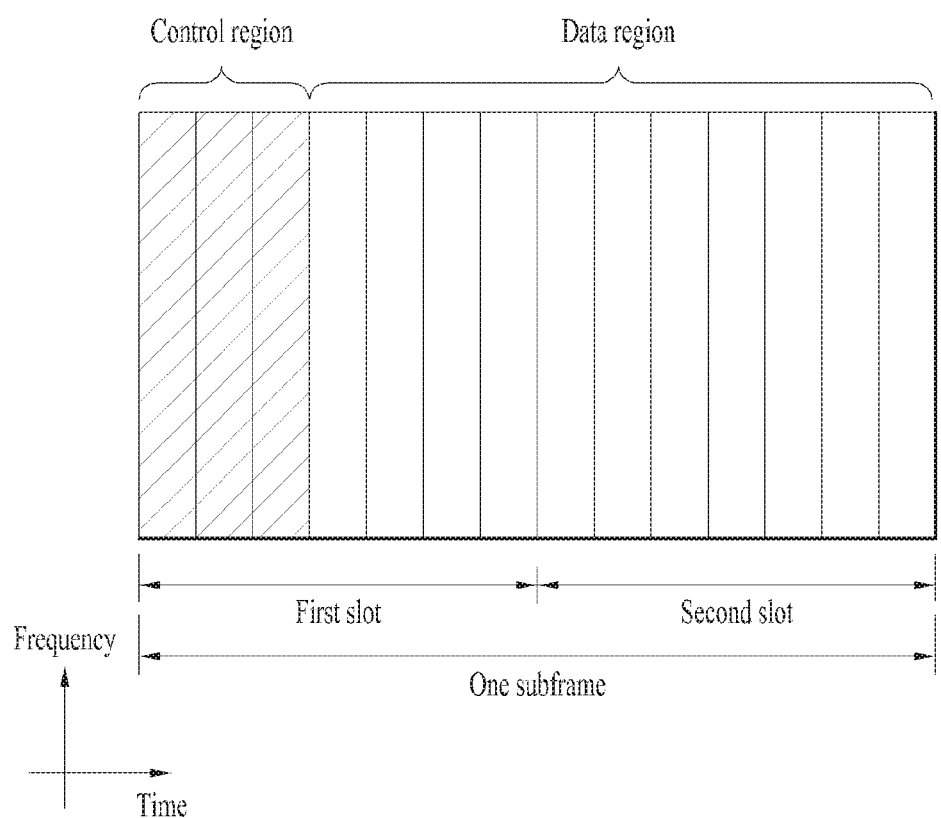
FIG. 5 is a diagram illustrating an exemplary structure of a downlink subframe.

FIG. 5 illustrates a structure of a DL subframe that may be used in embodiments of the present disclosure.

Referring to FIG. 5, up to three OFDM symbols of a DL subframe, starting from OFDM symbol 0 are used as a control region to which control channels are allocated and the other OFDM symbols of the DL subframe are used as a data region to which a PDSCH is allocated. DL control channels defined for the 3GPP LTE system include a Physical Control Format Indicator Channel (PCFICH), a PDCCH, and a Physical Hybrid ARQ Indicator Channel (PHICH).

The PCFICH is transmitted in the first OFDM symbol of a subframe, carrying information about the number of OFDM symbols used for transmission of control channels (i.e. the size of the control region) in the subframe. The PHICH is a response channel to a UL transmission, delivering an HARQ ACK/NACK signal. Control information carried on the PDCCH is called Downlink Control Information (DCI). The DCI transports UL resource assignment information, DL resource assignment information, or UL Transmission (Tx) power control commands for a UE group.

2. New Radio Access Technology System

As more and more communication devices require greater communication capacity, there is a need for mobile broadband communication enhanced over existing radio access technology (RAT). Massive Machine-Type Communications (MTC), which provides a variety of services by connecting multiple devices and objects anywhere and anytime, is also considered. In addition, communication system design considering services/UEs sensitive to reliability and latency is also under discussion.

Thus, introduction of a new radio access technology considering enhanced mobile broadband communication, massive MTC, and Ultra-Reliable and Low Latency Communication (URLLC) is being discussed. In the present invention, for simplicity, this technology will be referred to as New RAT.

2.1. Self-Contained Subframe Structure

Figure 6:
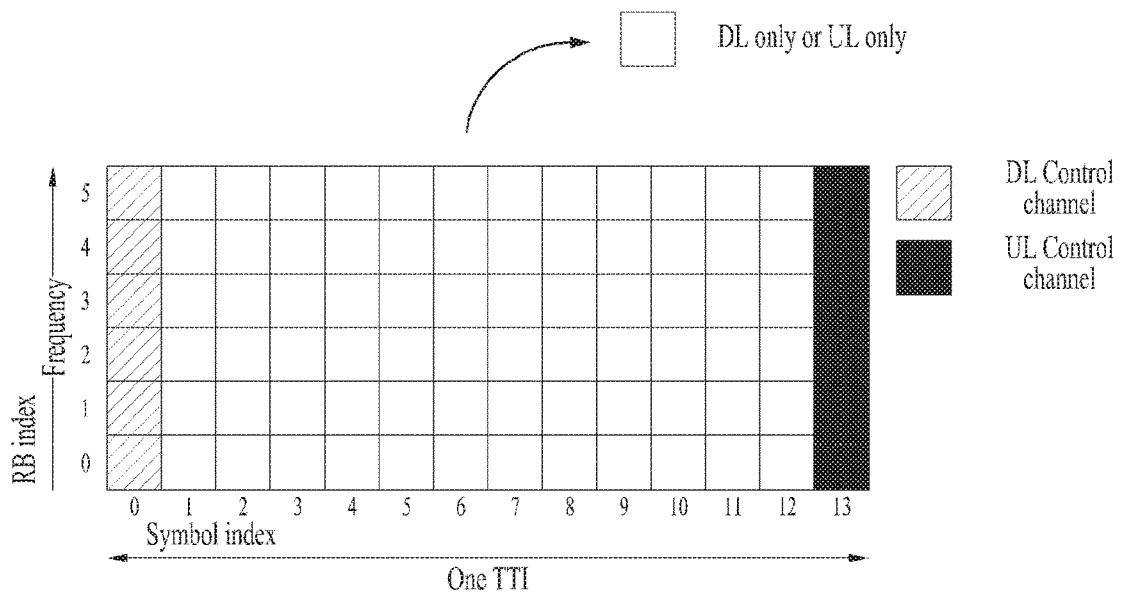
FIG. 6 is a diagram illustrating a self-contained subframe structure applicable to the present invention.

FIG. 6 is a diagram illustrating a self-contained subframe structure applicable to the present invention.

In the New RAT system to which the present invention is applicable, a self-contained subframe structure as shown in FIG. 6 is proposed in order to minimize data transmission latency in the TDD system.

In FIG. 6, the hatched region (e.g., symbol index=0) represents a downlink control region, and the black region (e.g., symbol index=13) represents an uplink control region. The other region (e.g., symbol index=1 to 12) may be used for downlink data transmission or for uplink data transmission.

In this structure, DL transmission and UL transmission may be sequentially performed in one subframe. In addition, DL data may be transmitted and received in one subframe and UL ACK/NACK therefor may be transmitted and received in the same subframe. As a result, this structure may reduce time taken to retransmit data when a data transmission error occurs, thereby minimizing the latency of final data transmission.

In such a self-contained subframe structure, a time gap having a certain time length is required in order for the base station and the UE to switch from the transmission mode to the reception mode or from the reception mode to the transmission mode. To this end, some OFDM symbols at the time of switching from DL to UL in the self-contained subframe structure may be set as a guard period (GP).

While a case where the self-contained subframe structure includes both the DL control region and the UL control region has been described above, the control regions may be selectively included in the self-contained subframe structure. In other words, the self-contained subframe structure according to the present invention may include not only the case of including both the DL control region and the UL control region but also the case of including either the DL control region or the UL control region alone as shown in FIG. 6.

For simplicity of explanation, the frame structure configured as above is referred to as a subframe, but this configuration can also be referred to as a frame or a slot. For example, in the New RAT system, one unit consisting of a plurality of symbols may be referred to as a slot. In the following description, a subframe or a frame may be replaced with the slot described above.

2.2. OFDM Numerology

The New RAT system uses the OFDM transmission scheme or a similar transmission scheme. Here, the New RAT system may typically have the OFDM numerology as shown in Table 2.

TABLE 2

| Parameter | Value |
| --- | --- |
| Subcarrier-spacing (Δf) | 75 kHz |
| OFDM symbol length | 13.33 μs |
| Cyclic Prefix(CP) length | 1.04 us/0.94 μs |
| System BW | 100 MHz |
| No. of available subcarriers | 1200 |
| Subframe length | 0.2 ms |
| Number of OFDM symbol per Subframe | 14 symbols |

Alternatively, the New RAT system may use the OFDM transmission scheme or a similar transmission scheme, and may use an OFDM numerology selected from among multiple OFDM numerologies as shown in Table 3. Specifically, as disclosed in Table 3, the New RAT system may take the 15 kHz subcarrier-spacing used in the LTE system as a base, and use an OFDM numerology having subcarrier-spacing of 30, 60, and 120 kHz, which are multiples of the 15 kHz subcarrier-spacing.

In this case, the cyclic prefix, the system bandwidth (BW) and the number of available subcarriers disclosed in Table 3 are merely an example that is applicable to the New RAT system according to the present invention, and the values thereof may vary depending on the implementation method. Typically, for the 60 kHz subcarrier-spacing, the system bandwidth may be set to 100 MHz. In this case, the number of available subcarriers may be greater than 1500 and less than 1666. Also, the subframe length and the number of OFDM symbols per subframe disclosed in Table 3 are merely an example that is applicable to the New RAT system according to the present invention, and the values thereof may vary depending on the implementation method.

TABLE 3

| Parameter | Value | Value | Value | Value |
|---|---|---|---|---|
| Subcarrier-spacing (Δf) | 15 kHz | 30 kHz | 60 kHz | 120 kHz |
| OFDM symbol length | 66.66 | 33.33 | 16.66 | 8.33 |
| Cyclic Prefix (CP) length | 5.20 µs/4.69 µs | 2.60 µs/2.34 µs | 1.30 µs/1.17 µs | 0.65 µs/0.59 µs |
| System BW | 20 MHz | 40 MHz | 80 MHz | 160 MHz |
| No. of available subcarriers | 1200 | 1200 | 1200 | 1200 |
| Subframe length | 1 ms | 0.5 ms | 0.25 ms | 0.125 ms |
| Number of OFDM symbol per Subframe | 14 symbols | 14 symbols | 14 symbols | 14 symbols |

2.3. Analog Beamforming

In a millimeter wave (mmW) system, since a wavelength is short, a plurality of antenna elements can be installed in the same area. That is, considering that the wavelength at 30 GHz band is 1 cm, a total of 100 antenna elements can be installed in a 5*5 cm panel at intervals of 0.5 lambda (wavelength) in the case of a 2-dimensional array. Therefore, in the mmW system, it is possible to improve the coverage or throughput by increasing the beamforming (BF) gain using multiple antenna elements.

In this case, each antenna element can include a transceiver unit (TXRU) to enable adjustment of transmit power and phase per antenna element. By doing so, each antenna element can perform independent beamforming per frequency resource.

However, installing TXRUs in all of the about 100 antenna elements is less feasible in terms of cost. Therefore, a method of mapping a plurality of antenna elements to one TXRU and adjusting the direction of a beam using an analog phase shifter has been considered. However, this method is disadvantageous in that frequency selective beamforming is impossible because only one beam direction is generated over the full band.

To solve this problem, as an intermediate form of digital BF and analog BF, hybrid BF with B TXRUs that are fewer than Q antenna elements can be considered. In the case of the hybrid BF, the number of beam directions that can be transmitted at the same time is limited to B or less, which depends on how B TXRUs and Q antenna elements are connected.

Figure 7:
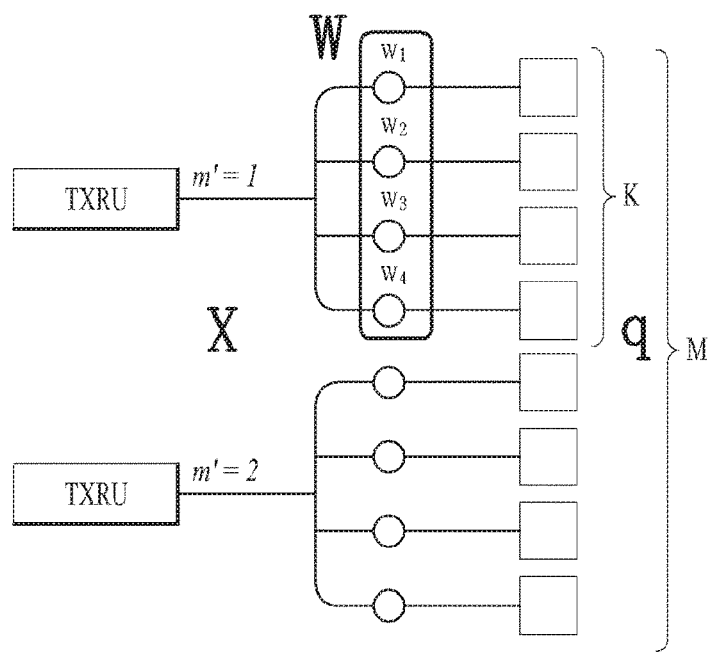
FIGS. 7 and 8 are diagrams illustrating representative methods for connecting TXRUs to antenna elements.
Figure 8:
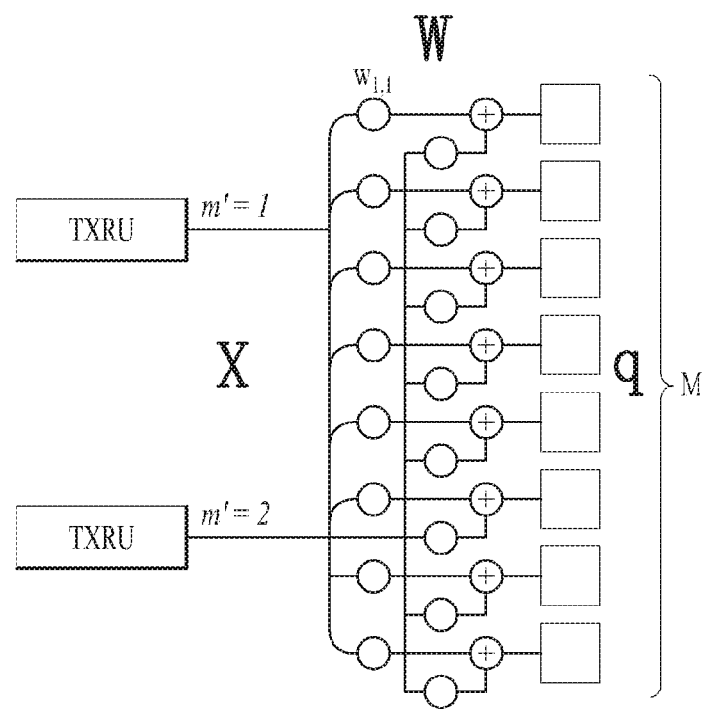

FIGS. 7 and 8 are diagrams illustrating representative methods for connecting TXRUs to antenna elements. Here, the TXRU virtualization model represents the relationship between TXRU output signals and antenna element output signals.

FIG. 7 shows a method for connecting TXRUs to sub-arrays. In FIG. 7, one antenna element is connected to one TXRU.

Meanwhile, FIG. 8 shows a method for connecting all TXRUs to all antenna elements. In FIG. 8, all antenna element are connected to all TXRUs. In this case, separate addition units are required to connect all antenna elements to all TXRUs as shown in FIG. 8.

In FIGS. 7 and 8, W indicates a phase vector weighted by an analog phase shifter. That is, W is a major parameter determining the direction of the analog beamforming. In this case, the mapping relationship between CSI-RS antenna ports and TXRUs may be 1:1 or 1-to-many.

The configuration shown in FIG. 7 has a disadvantage in that it is difficult to achieve beamforming focusing but has an advantage in that all antennas can be configured at low cost.

On the contrary, the configuration shown in FIG. 8 is advantageous in that beamforming focusing can be easily achieved. However, since all antenna elements are connected to the TXRU, it has a disadvantage of high cost.

2.4. CSI Feedback

In the 3GPP LTE or LTE-A system, user equipment (UE) has been defined to report channel state information (CSI) to a base station (BS or eNB). Herein, the CSI refers to information indicating the quality of a radio channel (or link) formed between the UE and an antenna port.

For example, the CSI may include a rank indicator (RI), a precoding matrix indicator (PMI), and a channel quality indicator (CQI).

Here, RI denotes rank information about the corresponding channel, which means the number of streams that the UE receives through the same time-frequency resource. This value is determined depending on the channel's Long Term Fading. Subsequently, the RI may be fed back to the BS by the UE, usually at a longer periodic interval than the PMI or CQI.

The PMI is a value reflecting the characteristics of a channel space and indicates a precoding index preferred by the UE based on a metric such as SINR.

The CQI is a value indicating the strength of a channel, and generally refers to a reception SINR that can be obtained when the BS uses the PMI.

In the 3GPP LTE or LTE-A system, the base station may set a plurality of CSI processes for the UE, and receive a report of the CSI for each process from the UE. Here, the CSI process is configured with a CSI-RS for specifying signal quality from the base station and a CSI-interference measurement (CSI-IM) resource for interference measurement.

2.5. Channel Coding

In general, since signals are transmitted through radio channels, errors occur frequently in a wireless communication system. Thus, a transmitting end encodes information using error correction codes and transmits the encoded information in order for a receiving end to correct an error that occurs in a radio channel, and this is called channel coding. The receiving end demodulates a received signal, performs decoding of the error correction codes, and then restores the information transmitted by the transmitting end. That is, the receiving end corrects the error in the received signal which occurs in the radio channel during the decoding process. There are various types of error correction codes, for example, a turbo code, a Low Density Parity Check (LDPC) code.

2.5.1. Turbo Code

The turbo code is implemented by a recursive systematic convolution encoder and an interleaver. The turbo code includes an interleaver for facilitating parallel decoding.

Interleaving by the interleaver can reduce the impact of a burst error which occurs when a signal is transmitted on a radio channel. In this case, for example, a Quadratic Polynomial Permutation (QPP) interleaver may be used.

Meanwhile, it is known that as the size of a data block increases, the performance of the turbo code also increases. In a real communication system, a data block with a predetermined size or greater is divided into several small data blocks, each of them is encoded for convenience of implementation.

Figure 9:
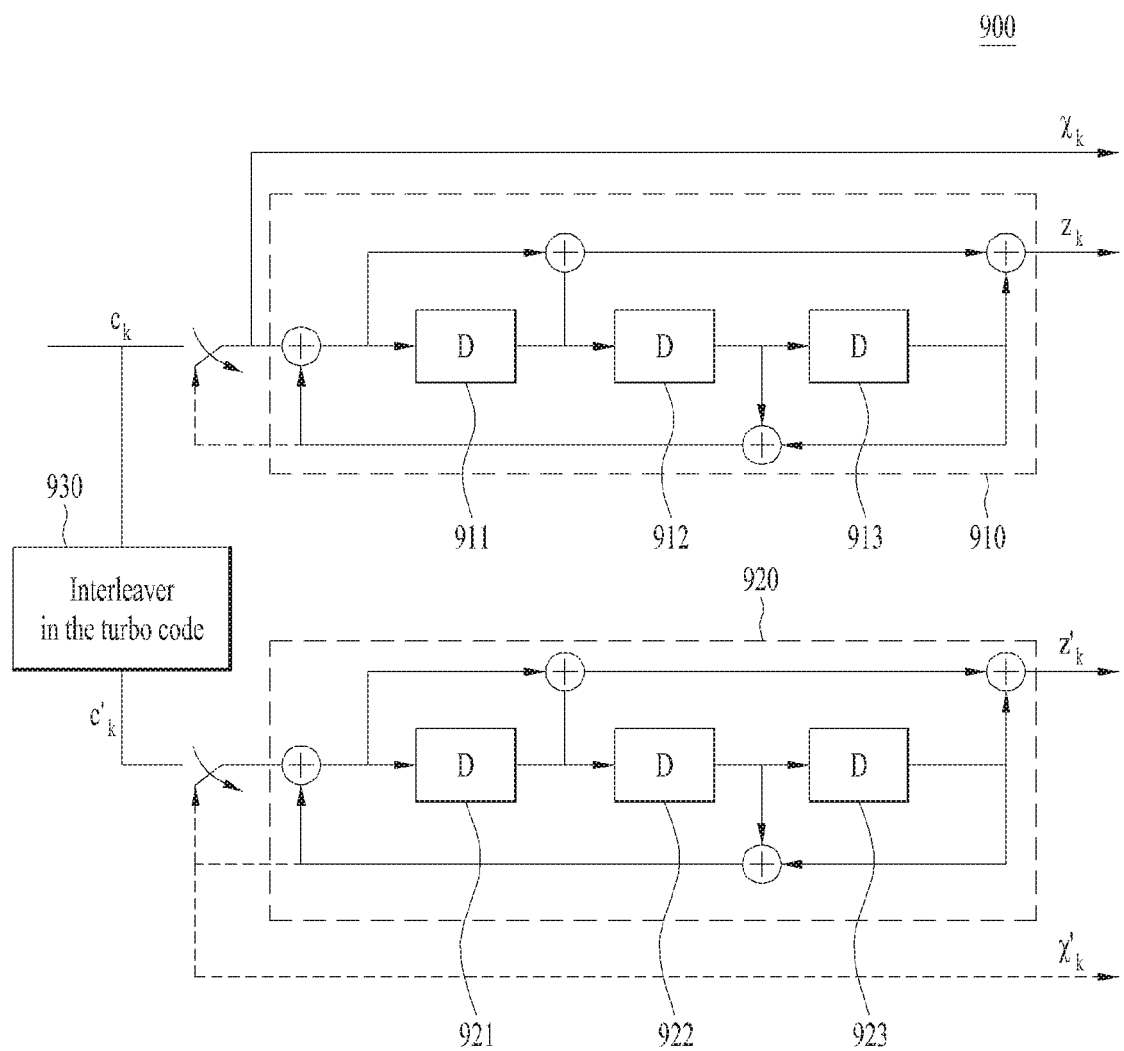
FIG. 9 illustrates a turbo encoder.

FIG. 9 illustrates a turbo encoder.

The coding scheme of a turbo encoder 900 corresponds to a Parallel Concatenated Convolutional Code (PCCC) with two eight-state constituent encoders 910 and 920 and one turbo code internal interleaver 930

Referring to FIG. 9, the turbo encoder 900 includes a first constituent encoder 910, a second constituent encoder 920, and the turbo code internal interleaver 930. Each of the first and second constituent encoders 910 and 920 corresponds to an eight-state constituent encoder. Each of the first and second constituent encoders 910 and 920 has a structure similar to that of the RSC encoder shown in FIG. 3. The first constituent encoder 910 includes three delayers 911, 912, and 913, and the second constituent encoder 920 includes three delayers 921, 922, and 923.

In FIG. 9, D is a value indicated according to the coding scheme, and $c_k$ is an input to the turbo encoder 900. The outputs from the first and second constituent encoders 910 and 920 are denoted by $z_k$ and $z'_k$, respectively. The value outputted from the turbo code internal interleaver 930 is denoted by $c'_k$. In general, each of the delayers 911, 912, 913, 921, 922, and 923 can delay an input value by one clock. However, each of the delayers 911, 912, 913, 921, 922, and 923 may be configured to delay an input value by one clock or more according to its internal configuration. Each of the delayers 911, 912, 913, 921, 922, and 923 may be implemented using a shift register. In this case, the delayers 911, 912, 913, 921, 922, and 923 may be configured to delay input values by a predetermined number of clocks and output to next delayers 911, 912, 913, 921, 922, and 923.

The turbo code internal interleaver 930 can reduce the impact of a burst error which may occur when a signal is transmitted on a radio channel. For example, the turbo code internal interleaver 930 may be a Quadratic Polynomial Permutation (QPP) interleaver.

The LTE system uses the turbo code as a Forward Error Correction (FEC) code. For example, a data block coded by the turbo code may include three sub-blocks. In this case, one sub-block may be equivalent to m-bit payload, another sub-block may be composed of n/2 parity bits for the payload, which is calculated using an Recursive Systematic Convolution (RSC) code, and the other sub-block may be composed of n/2 parity bits for permutation of the payload data calculated by using the RSC code. For example, the permutation may be performed by an interleaver. Thus, the payload and two different parity-bit sub-blocks may consist of the single block. For example, if m is equal to n/2, one block has a code rate of 1/3.

In the first consistent encoder 910, the process for converting the input $c_k$ into the encoded bit $z_k$ may have two different paths. The first path is configured such that an input end is connected to an output end without output feedback, and the second path is configured such that an input end is fed back to another input end again.

In the first path, the input $c_k$, the input $c_k$ that passes through the delayer 911, and the input $c_k$ that passes through each of the delayers 911, 912, and 913 enter the output end. The relationship between the input and output ends based on the first path can be expressed as a polynomial. The polynomial for the first path is called a forward generator polynomial and can be expressed as g1 shown in Equation 1 below.

$$g1(D)=1+D+D^3 \quad \text{[Equation 1]}$$

Meanwhile, in the second path, the input $c_k$, the input $c_k$ that passes through the delayers 911 and 912, and the input $c_k$ that passes through the delayers 911, 912, and 913 is fed back to the input end. The polynomial for the second path is called a recursive generator polynomial and can be expressed as g0 in Equation 2 below.

$$g0(D)=1+D^2+D^3 \quad \text{[Equation 2]}$$

In Equations 1 and 2, "+" means the Exclusive OR (XOR), and "1" means that an input is delayed zero times. In addition, $D^n$ means that an input is delayed n times.

2.5.2. Low Density Parity Check (LDPC) Code

The LDPC code, which corresponds to a linear block code, has been used in IEEE 802.11n, IEEE 802.11ac, Digital Video Broadcasting (DVB), etc. The LDPC code may be implemented using a generation matrix and a parity check matrix. In the LDPC code, data may be encoded by multiplying message bits with the generation matrix. In general, according to the communication standard using the LDPC code, the parity check matrix can be used instead of the generation matrix. For example, data may be encoded using the parity check matrix.

A linear block code may be generated based on a generation matrix G or a parity check matrix H. The linear block code is configured such that the value of $Hc^t$ is zero for every codeword c. Similar to other linear code blocks, the LDPC code may be decoded by checking whether the product of the parity check matrix H and the codeword c is '0'. For example, the LDPC code may be decoded by checking the product (i.e., $Hc^t$) of the transpose matrix of the codeword c and the parity check matrix is 0.

In the LDPC code, most elements of the parity check matrix are 0, and compared to the code length, the number of non-zero elements is relatively small. Thus, the LDPC code can be repeatedly decoded on the basis of probability. In the initially proposed LDPC code, the parity check matrix is defined to have a non-systematic form and a small weight is equally applied to rows and columns of the parity check matrix. Here, the weight may mean the number of is included in a row or a column.

As described above, the number of non-zero elements in the parity check matrix H of the LDPC code is relatively small. Thus, the LDPC code has low decoding complexity and shows performance close to Shannon's theoretical limit. Due to high error correction performance and low decoding complexity, the LDPC code is considered to be suitable for high-speed wireless communication.

Hereinafter, a structured LDPC code will be described.

Figure 10:
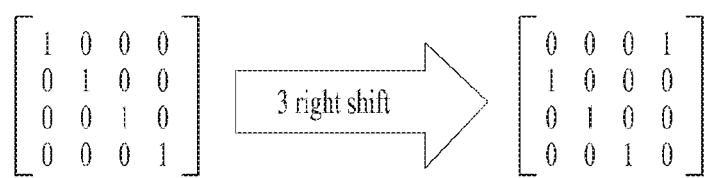
FIG. 10 illustrates individual elements of a parity check matrix of an Low Density Parity Check (LDPC) code.

As described above, the parity check matrix H can be used for generation of the LDPC code. The matrix H is composed of many 0 elements and few 1 elements. The size of the matrix H may be equal to or more than $10^5$ bits and thus, a large memory may be required to represent the matrix H. The elements in the matrix H of the structure LDPC code can be represented as sub-blocks with predetermined sizes as shown in FIG. 10. In FIG. 10, each element of the matrix H corresponds to one sub-block.

Figure 11:
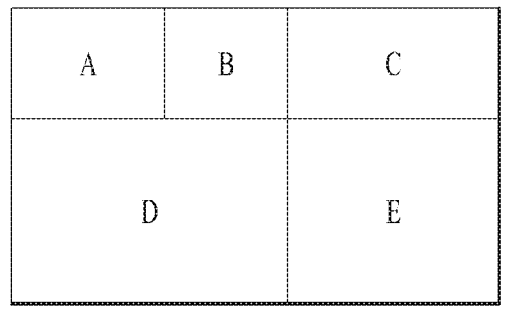
FIG. 11 illustrates an example of a parity check matrix applicable to an LDPC code.

FIG. 11 illustrates an example of a parity check matrix applicable to an LDPC code.

As shown in FIG. 11, the parity check matrix may be composed of five sub-matrices: A, B, C, D, and E. Here, A corresponds to systematic bits, and B corresponds to parity bits in the form of a square. The first or last column may have a weight of 1. Non-zero values are located at the last row of B, and the corresponding row may have a weight of 1.

If there is a column with a weight of 1, the remaining columns may include a square matrix of which the first column has a weight of 3. The columns after the 3-weight column may have a dual diagonal structure.

If there is no column with a weight of 1, B may be composed of square matrices, each of which having the first column with a weight of 3. The columns after the 3-weight column may have a dual diagonal structure.

In addition, C is a zero matrix, and E is an identify matrix.

3. Proposed Embodiments

The New RAT (NR) system to which the present invention is applicable requires fast HARQ feedback to improve the data transmission latency. In other words, the NR system requires a fast decoding scheme compared to the prior art. Therefore, in addition to the turbo coding used in the LTE system, other channel coding schemes have been considered. For example, the introduction of a new coding scheme such as LDPC or polar coding with low coding complexity have been discussed.

It is expected that the NR system will coexist with the LTE system for a long period of time for some reasons such as backward compatibility. Therefore, a terminal applicable to the present invention should be able to support both the LTE RAT and NEW RAT using a dual-mode technique or support a mode where LTE bands interact with NEW RAT bands through carrier aggregation (CA). Further, to improve data transmission rates, the UE should be able to support a mode where multiple component carriers in the NEW RAT bands are carrier-aggregated as well as a mode where multiple component carriers in the LTE bands are carrier-aggregated.

In a macro-cell deployment, the UE geometry (i.e., the average received SINR of a UE on the assumption of the maximum power transmission at all neighbor BSs) is distributed in the range of −6 to 20 [dB] due to inter-sector interference caused by side-lobes of beams transmitted from antennas in three sectors. Thus, the received Signal to Interference plus Noise Ratio (SINR) can be improved depending on the traffic loads of neighbor cells, but if resource utilization is high, the degree of the improvement is not large.

Unlike the macro-cell deployment, in a small cell, the UE geometry is distributed in the range of 0 to 50 [dB] depending on omni-directional antennas and Reference Signal Received Quality (RSRQ) threshold setting for handover. In addition, it is expected that the actual received SINR is much higher because cells do not have high traffic loads. Moreover, when the analog beamforming is applied, the neighbor cells may generate interference only in some areas. Thus, the received SINR can be further improved if PDSCH transmission is performed. That is, the probability that the received SINR goes below 10 dB is not very high.

For these reasons, different channel coding schemes should be designed for the two environments mentioned in the foregoing description. In other words, the channel coding for a macro cell needs to be designed to provide (or cover) a wide Signal to Noise Ratio (SNR) range, whereas the channel coding for a small cell needs to be designed to reduce complexity rather than to improve performance.

Hence, the present invention proposes a method capable of applying the LTE-turbo code scheme suitable for deployment of macro cells and the LDPC scheme suitable for small cells for capacity boost adaptively depending on situations.

3.1. First Method [Configuration of Coding Scheme Per Component Carrier (CC)]

The UE applicable to the present invention may be configured to support dual mode for the LTE and NR. The UE may include turbo coding based decoder hardware (HW) for 5 CC LTE (5 CCs for the LTE), which operates on a 100 MHz band and new coding based decoder HW for supporting the NR, which operates on another 100 MHz band. Here, the new coding scheme mentioned in the present invention means a coding scheme newly applied to the NR system to which the present invention is applicable and may include, for example, coding schemes such as an LDPC code, a polar code, etc. Hereinafter, for convenience of description, coding schemes different from the turbo code is commonly called the new coding scheme.

The UE can support data transmission over the entire 200 MHz bandwidth through the CA as follows.

Case 1) 5CC LTE (Turbo)+1CC NR (new coding)
Case 2) 1CC NR (Turbo)+1CC NR (new coding)

In case 2 of the present proposed method, although the same NR type of CCs are used, a different coding scheme may be applied per CC depending on the capability of the UE. Otherwise, the UE should be equipped with decoder HW for new coding that operates on the 200 MHz band in order to support 2CC NR.

During a UE capability reporting procedure for initial access, the UE applicable to the present invention may report to a BS information on how many CCs the UE can support for the NR, information on how many CCs among the CCs that the UE can support for the NR the UE can support using the legacy turbo code scheme, and information on how many CCs the UE can support using the new coding scheme. For example, the UE may report to the BS a combination (CC1, CC2) of the number (CC1) of CCs the UE can support using coding scheme 1 (i.e., legacy turbo coding) and the number (CC2) of CCs the UE can support using coding scheme 2 (i.e., new coding scheme, for example, LDPC coding, etc.).

In this case, the UE may report all combinations that the UE can support to the BS. For example, if the UE is designed to share the same HW in decoding for the two types of coding schemes, the UE may report the BS that the UE can support the following combinations: (CC1, CC2)=(2, 0), (1, 1), and (0, 2). Alternatively, if the UE is designed to use different HW in decoding for the two types of coding schemes, the UE may report the BS that the UE can support only the following combination: (CC1, CC2)=(1, 1) for 2CC.

As a modification example, the UE applicable to the present invention may report to the BS the maximum data rate R1 that the UE can support using coding scheme 1 and the maximum data rate R2 that the UE can support using coding scheme 2 during the UE capability reporting procedure for the initial access. In this case, the data rates may be represented as the number of Transport Blocks (TBs) transmitted every Transmission Time Interval (TTI).

The above-described proposed methods can be extensively applied when the NR supports two or more channel coding schemes. For example, when the UE according to the present invention uses three channel coding schemes interchangeably, the UE may report to the BS combinations (CC1, CC2, CC3) of the numbers of CCs that the UE can support using the individual coding schemes. Alternatively, the UE may report to the BS combinations (R1, R2, R3) of the maximum data rates that the UE can support using the individual coding schemes.

In response to this, based on the received UE capability report, the BS may configure each CC or a PDSCH transmission method for each CC for the UE, designate a channel coding scheme that will be used for PDSCH transmission, and inform the UE of the designated channel coding scheme. Upon receiving such information, the UE may receive data on a corresponding CC and decode the data using a decoder suitable for the designated channel coding scheme.

As another modification example, the UE according to the present invention may report to the BS information on a band combination list that the UE can support during the UE capability reporting procedure for the initial access. In addition, the UE may report a channel coding scheme supported in each band in the supportable band combination list. Based on these reports, the BS and UE may determine a channel coding scheme that will be used per CC in performing the CA operation related to the configured band combination.

The above-described proposed method can be applied to a PUSCH corresponding to a physical channel for UL data transmission. In this case, the UE according to the present invention may separately report the decoding capability (DL data reception capability) and the encoding capability (UL data reception capability) of each channel coding scheme to the BS during the UE capability reporting procedure for the initial access. Alternatively, when the encoding capability of the UE supports the two channel coding schemes, the UE may report only the decoding capability of each channel coding scheme to the BS. When configuring each CC or a PUSCH transmission method for each CC for the UE, the BS may designate a channel coding scheme that will be used for PUSCH transmission and then inform the UE of the designated channel coding scheme. In this case, such information may be transmitted via RRC signaling or DCI. Thereafter, the UE may use an encoder suitable for the designated channel coding scheme during the encoding procedure for data transmission on a corresponding CC.

Additionally, the NR system to which the present invention is applicable can be designed to operate on all frequency bands from 700 MHz to 100 GHz using various OFDM numerology shown in Table 3. Since as the transmission frequency band becomes higher, the suitable subcarrier spacing increases, a single value may be determined in advance for the OFDM subcarrier spacing per frequency band. Alternatively, several values may be determined for the OFDM subcarrier spacing per frequency.

For example, considering that a frequency band of 6 GHz or lower has good propagation characteristics, it is suitable for the macro-cell deployment. And, in this case, subcarrier spacing of 15 or 30 kHz may be applied. On the contrary, considering that a frequency band of 6 GHz or higher can support wideband transmission in spite of poor propagation characteristics, subcarrier spacing of 60 kHz or higher may be suitable.

Based on these features, the BS can determine channel coding schemes according to the subcarrier spacing per CC. For example, the turbo code scheme may be used for a CC where the 15 or 30 kHz subcarrier spacing is applied, and the LDPC scheme may be used for a CC where the 60 kHz subcarrier spacing or higher is applied. That is, the BS and UE may perform DL and UL data transmission according to the determined channel coding schemes.

In this case, based on the magnitude of the main subcarrier spacing used in each CC, the UE can recognize the channel coding scheme of a data channel used for a corresponding CC. In addition, the UE supporting the NR system may report to the BS how many CCs the UE can support per subcarrier spacing during the UE capability reporting procedure for the initial access. By doing so, the UE supporting the NR system may indirectly inform the BS which channel coding schemes the UE can support.

As another example, the BS according to the present invention may determine channel coding schemes to be used based on the transmission bandwidth of each CC. For example, if a CC has a bandwidth of 20 MHz or smaller, the turbo coding scheme may be used. On the other hand, if a CC has a bandwidth of 20 MHz or larger, the LDPC scheme may be used. That is, the BS and UE may perform DL and UL data transmission according to the determined channel coding schemes.

In this case, based on the bandwidth configured for each CC, the UE can recognize the channel coding scheme of a data channel used for a corresponding CC. In addition, the UE supporting the NR system may report to the BS how many CCs the UE can support per bandwidth during the UE capability reporting procedure for the initial access. By doing so, the UE supporting the NR system may indirectly inform the BS which channel coding schemes the UE can support.

As a further example, the BS according to the present invention may determine channel coding schemes to be used based on the transmission band of each CC. For example, the turbo coding scheme may be used for a CC in a frequency band of 6 GHz or lower, whereas the LDPC scheme may be used for a CC in a frequency band of 6 GHz or higher. That is, the BS and UE may perform DL and UL data transmission according to the determined channel coding schemes.

In this case, based on the band configured for each CC, the UE can recognize the channel coding scheme of a data channel used for a corresponding CC. In addition, the UE supporting the NR system may report to the BS how many CCs the UE can support per band during the UE capability reporting procedure for the initial access. By doing so, the UE supporting the NR system may indirectly inform the BS which channel coding schemes the UE can support.

In addition, the proposed method has an advantage in that if the turbo code scheme is used for a CC where the 15 kHz subcarrier spacing is applied, compatible communication can be achieved between the LTE system and NR system. As a representative important use case, compatible communication between an LTE V2X (Vehicle-to-X (vehicle, nomad, etc.)) device and an NR eV2X (enhanced V2X) device can be considered for safety application.

3.2. Second Method [Configuration of Physical Channel for Data Transmission Per CC]

The second method of the present invention proposes to change the names of physical channels for data transmission according to channel coding schemes that will be applied. For example, a DL data transmission channel to which coding scheme 1 (e.g., (legacy) turbo code scheme) is applied can be named a Primary PDSCH (PPDSCH), and a DL data transmission channel to which coding scheme 2 (new coding scheme, for example, LDPC coding, polar coding, etc.) is applied can be named as a secondary PDSCH (SPDSCH). In this case, not only may the channel coding schemes applied to the PPDSCH and SPDSCH vary, but also the peak data rates and rate matching processes applied to the two channels may be different. In addition, the payload sizes and MCSs applied to the two channels may be different from each other.

In this case, during a UE capability reporting procedure for initial access, a UE applicable to the present invention may report to a BS a combination (CC1, CC2) of the number (CC1) of CCs that can be supported by the PPDSCH and the number (CC2) of CCs that can be supported by the SPDSCH. The UE may report all combinations that the UE can support to the BS. In response to this, while configuring each CC for the UE based on the received UE capability report, the BS may inform the UE which physical channel (i.e., either the PPDSCH or SPDSCH) will be used. Such information may be transmitted via RRC signaling or DCI. Upon receiving the information, the UE may receive/decode a corresponding signal using a decoder suitable for the designated physical channel while receiving data on a corresponding CC.

The above-described proposed method can be applied to a PUSCH corresponding to a physical channel for UL data transmission. In this case, a channel to which coding scheme 1 is applied can be named a Primary PUSCH (PPUSCH), and a DL data transmission channel to which coding scheme 2 is applied can be named as a secondary PUSCH (SPUSCH). The UE according to the present invention may report to the BS a combination (CC1, CC2) of the number (CC1) of CCs that can be supported by the PPUSCH and the number (CC2) of CCs that can be supported by the SPUSCH during the UE capability reporting procedure for the initial access. At this time, the UE may report all combinations that the UE can support to the BS. Based on the UE capability report, the BS may configure each CC for the UE and inform the UE which physical channel (either the PPUSCH or SPUSCH) will be used. Such information may be transmitted via RRC signaling or DCI. Upon receiving the information, the UE may transmit corresponding data on a corresponding CC using an encoder for the designated physical channel.

As a modification example of the method, the UE applicable to the present invention may report to the BS a band combination list that the UE can support during the UE capability reporting procedure for the initial access. In addition, the UE may report to the BS physical channels for DL and UL data transmission supported in each band in the supportable band combination list. Based on these reports, the BS and UE may determine the DL physical channel (PPDSCH or SPDSCH) and the UL physical channel (PPUSCH or SPUSCH) to be used per CC in performing the CA operation related to the configured band combination.

3.3. Third Method [Configuration of Coding Scheme According to Data Rate]

The third method of the present invention proposes to determine a channel coding scheme that will be used according to the transmission data rate (or TB size) of a PDSCH or PUSCH. For example, a BS or UE according to the present invention may select one of the following two channel coding schemes with different mother code rates based on data rates and then use the selected coding schemes.

Channel coding scheme 1: Turbo code and 1/3 code rate
Channel coding scheme 2: LDPC and 1/2 code rate In other words, in the case of a low data rate (or when a TB with a predetermined size or smaller is transmitted), the BS or UE according to the present invention may use channel coding scheme 1 to obtain coding gain. In this case, the BS or UE may support a low MCS using channel coding scheme 1.

On the other hand, in the case of a high data rate (or when a TB with a predetermined size or larger is transmitted), the BS or UE according to the present invention may use channel coding scheme 2 to reduce decoding complexity. In this case, the BS or UE may support a high MCS using channel coding scheme 2.

Alternatively, the BS or UE according to the present invention may use different methods in segmenting a TB into code blocks (CBs), each of which has a predetermined size, and performing encoding per CB according to the number of CBs. For example, when the number of CBs is equal to or less than a predetermined value, the BS or UE according to the present invention may use channel coding scheme 1. On the contrary, when such a condition is not satisfied, the BS and UE may use channel coding scheme 2.

Alternatively, if a TB has a predetermined size or larger, the BS or UE according to the present invention may create CBs by segmenting the TB. If each CB has a predetermined size or smaller, the BS or UE may use channel coding scheme 1. If such a condition is not satisfied, the BS or UE may use channel coding scheme 2.

More specifically, a method of segmenting a TB into CBs with different sizes instead of segmenting the TB into CBs with the same size can be applied. For example, when the maximum size of a CB is 5000 bits, the BS or UE according to the present invention may segment a TB with a size of 23000 bits into four CBs each having a size of 5000 bits and a CB with a size of 3000 bits. Then, the BS or UE may apply channel coding scheme 2 to the 5000-bit CBs and apply channel coding scheme 1 to the 3000-bit CB. In other words, when a CB has the maximum size, the BS or UE according to the present invention may use channel coding scheme 2. On the other hand, when the size of a CB is smaller than the maximum size, the BS or UE may use channel coding scheme 1.

As a modification example of the proposed method, the BS or UE according to the present invention may determine a channel coding scheme that will be used according to the coding rate of a transmitted PDSCH or PUSCH (or the ratio of the number of transmission information bits to the number of coded bits). The coding rate may be determined by the number of coded bits transmitted on the final physical channel after a rate matching process is performed by a circular buffer, etc. Unlike the coding rate, a mother code rate may be determined by the number of coded bits generated by an encoder, that is, the number of coded bits inputted into a circular buffer. Therefore, when the coding rate is low, the BS or UE according to the present invention may use channel coding scheme 1 in order to obtain the coding gain. On the other hand, when the coding rate is high, the BS or UE according to the present invention may use channel coding scheme 2 in order to reduce the decoding complexity. Here, the coding rate may mean a coding rate determined when an initial PDSCH or PUSCH is transmitted according to HARQ.

As a modification example of the proposed method, the BS or UE according to the present invention may determine a channel coding scheme that will be used according to the bandwidth or PRB size allocated for PDSCH or PUSCH transmission. For example, when the allocated bandwidth is equal to or higher than a predetermined value, the BS or UE according to the present invention may use channel coding scheme 2 to reduce the decoding complexity. In Multi Input Multi Output (MIMO) transmission, if a TB is transmitted via multiple layers, the BS or UE according to the present invention may determine a channel coding scheme that will be used based on the size of an effective PRB allocated to a PDSCH or PUSCH. Here, the size of the effective PRB can be defined by the product of the transmission layers and PRB.

In addition, which size of a TB (coding rate or bandwidth) is used for determining or changing a channel coding scheme that will be used can be promised between the BS and UE in advance. Alternatively, the UE may report a value that the UE can support during the UE capability reporting procedure for the initial access, and the BS may inform the UE of the reference value (e.g., TB size, coding rate value, bandwidth size, etc.) for changing or determining the channel coding scheme by indicating the corresponding value while configuring a PDSCH or PUSCH. In this case, such information may be transmitted to the UE through RRC signaling, DCI, or the like.

3.4. Fourth Method [Indication of Coding Scheme Via DCI]

A BS can receive data from a plurality of UEs through a plurality of CCs. Thus, from the perspective of the BS, it can be more efficient to dynamically determine a channel coding scheme according to the sizes of relative data rates of PUSCHs received through all CCs in the same subframe than to determine the channel coding scheme with reference to a specific threshold for data rates as described in the third method. Therefore, the fourth method according to the present invention proposes that a BS determines a channel coding scheme that will be used for PUSCH transmission and then inform a UE of the channel coding scheme through grant DCI that allows the PUSCH transmission. Alternatively, the fourth method according to the present invention proposes that a BS determines a channel coding scheme that will be used for PDSCH transmission and informs a UE of the channel coding scheme through scheduling DCI that informs the PDSCH transmission.

When a PDSCH or PUSCH is retransmitted by HARQ, it is possible to use the channel coding scheme applied to initial transmission. Thus, DCI for initial transmission may include an indicator indicating a channel coding scheme, but DCI for requesting retransmission may not include the corresponding indicator.

For example, in the case of HARQ transmission based on Incremental Redundancy (IR), a channel coding indicator indicating a channel coding scheme may be transmitted together with a Redundancy Version (RV) number. In other words, if the RV number of transmitted coded bits used for HARQ initial transmission is 0, the channel coding indicator indicating the channel coding scheme is included. On the other hand, if the RV number has other values except 0, which is mainly used for retransmission, the channel coding indicator may not be included in corresponding DCI. For example, the BS according to the present invention may indicate RVs and channel coding schemes through fields of DCI as shown in Table 4.

TABLE 4

| indicator | RV number | Channel coding scheme |
|---|---|---|
| 0 | RV 0 | Coding scheme 1 |
| 1 | RV 0 | Coding scheme 2 |
| 2 | RV 1 | Same coding scheme as initial transmission |
| 3 | RV 2 | Same coding scheme as initial transmission |

Meanwhile, when channel coding scheme 1 is applied to HARQ transmission based on Chase Combining (CC) and channel coding scheme 2 is applied to IR-based HARQ transmission, the BS according to the present invention may indicate RVs and channel coding schemes through fields of DCI as shown in Table 5.

TABLE 5

| indicator | RV number | Channel coding scheme |
|---|---|---|
| 0 | RV 0 | Coding scheme 1 |
| 1 | RV 0 | Coding scheme 2 |
| 2 | RV 1 | Coding scheme 2 |
| 3 | RV 2 | Coding scheme 2 |

Referring to Table 5, when the UE or BS retransmits data, the UE or BS may use a channel coding scheme different from that used for the initial transmission.

3.5. Fifth Method [Indication of Physical Transmission Channel Via DCI]

The fifth method according to the present invention proposes that when the names of physical channels for data transmission are changed according to applied channel coding schemes as described in the second method, a BS dynamically informs a UE whether either a PPDSCH to which coding scheme 1 is applied or an SPDSCH to which coding scheme 2 is applied will be transmitted through DL-related DCI. Alternatively, the fifth method according to the present invention proposes that a BS dynamically informs a UE whether either a PPUSCH to which coding scheme 1 is applied or an SPUSCH to which coding scheme 2 is applied will be transmitted for UL data transmission through UL-related DCI.

In this case, if DCI indicating PPDSCH transmission has the same size as that of DCI indicating SPDSCH transmission, the BS according to the present invention may inform the type of a physical transmission channel carrying DL data through a specific field included in the DL-related DCI. On the contrary, if the size of the DCI indicating the PPDSCH transmission is different from that of the DCI indicating the SPDSCH transmission, the UE according to the present invention may perform blind decoding of DCI associated with each type of physical channel for DL data transmission in a PDCCH transmission region while performing blind search for DCI transmitted to the UE. In this case, a region in which PPDSCH-related DCI can be transmitted (i.e., search space for the PPDSCH-related DCI) and a region in which SPDSCH-related DCI can be transmitted (i.e., search space for the SPDSCH-related DCI) may be separately configured for the UE within a transmission region of a control channel or a Control Channel Element (CCE) transmission region. At this time, it is regulated that either a PPDSCH or SPDSCH is transmitted to one UE in one subframe.

If DCI indicating PPUSCH transmission has the same size as that of DCI indicating SPUSCH transmission, the BS according to the present invention may inform the type of a physical transmission channel carrying UL data through a specific field included in the UL-related DCI. On the contrary, if the size of the DCI indicating the PPUSCH transmission is different from that of the DCI indicating the SPUSCH transmission, the UE according to the present invention may perform blind decoding of DCI associated with each type of physical channel for UL data transmission in a PDCCH transmission region while performing blind search for DCI transmitted to the UE.

In this case, not only channel coding schemes applied to a PPDSCH and an SPDSCH but also MCS sets and/or resource allocation granularity applied to the two channels may differ. For example, the PPDSCH may be configured such that it supports 25 MCSs and a PDSCH transmission resource is allocated on one PRB basis. In addition, the PPDSCH may be configured such that only a predetermined number of RBs or less are allocated as transmission resources. In other words, the PPDSCH may be restricted such that 100 RBs or more are not allocated as transmission resources. Unlike the PPDSCH, the SPDSCH may be configured such that it supports 8 MCSs and a PDSCH transmission resource is allocated on 4-PRB basis. In addition, the SPDSCH may be configured such that only a predetermined number of RBs or more are allocated as transmission resources. That is, the SPDSCH may be restricted such that 50 RBs or less are not allocated as transmission resources.

3.6. Summary

Figure 12:
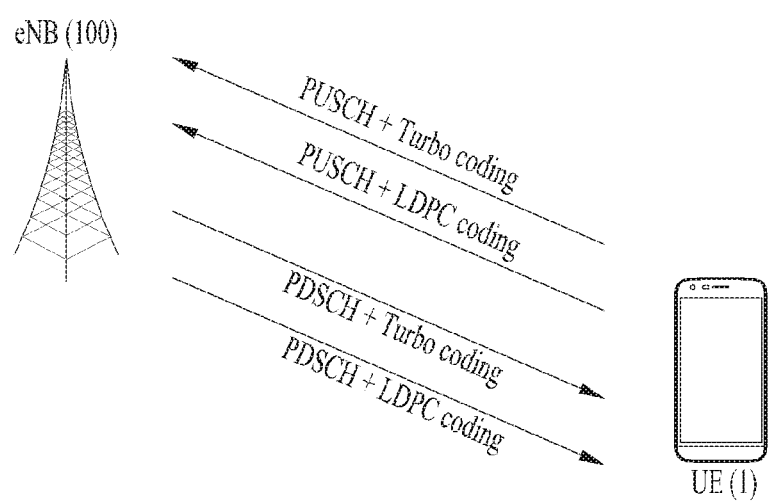
FIG. 12 schematically illustrates data signal transmission and reception operation between a BS and a UE according to the present invention.

FIG. 12 schematically illustrates data signal transmission and reception operation between a BS and a UE according to the present invention.

As shown in FIG. 12, the BS and UE can use the turbo coding scheme or LDPC coding scheme to transmit and receive a PDSCH or PUSCH. In this case, the individual signal transmission configurations shown in FIG. 12 may be independent from each other. For example, among the four signal transmission configurations of FIG. 12, only one signal transmission configuration may exist, or all the four signal transmission configurations may exist. Moreover, considering a Carrier Aggregation (CA) environment, each of the signal transmission configurations shown in FIG. 12 may be extended to a plurality of signal transmission configurations. Thus, it could be interpreted to mean that the following description includes all the above-described features.

First, the BS according to the present invention operates as follows.

The BS determines a first coding scheme to be applied to a downlink data signal to be transmitted to a UE. In this case, either a turbo coding scheme or a Low Density Parity Check (LDPC) coding scheme may be used as the first coding scheme.

In this case, the BS may consider, as reference conditions for determining the first coding scheme, at least one of: (1) a Component Carrier (CC) on which the downlink data signal is transmitted; (2) subcarrier spacing applied to the CC on which the downlink data signal is transmitted; (3) a transmission bandwidth applied to the CC on which the downlink data signal is transmitted; and (4) a transmission band of the CC on which the downlink data signal is transmitted.

For example, if the subcarrier spacing applied to the CC on which the downlink data signal is transmitted is greater than a first reference value, the BS may apply the LDPC coding scheme to the corresponding downlink data signal. On the contrary, if the above condition is not satisfied, the BS may apply the turbo coding scheme to the corresponding downlink data signal. In this case, 30 kHz subcarrier spacing or 60 kHz subcarrier spacing may be used as the first reference value.

As another example, if the transmission bandwidth applied to the CC on which the downlink data signal is transmitted is greater than a second reference value, the BS may apply the LDPC coding scheme to the corresponding downlink data signal. On the contrary, if the above condition is not satisfied, the BS may apply the turbo coding scheme to the corresponding downlink data signal. In this case, a bandwidth of 20 MHz may be used as the second reference value.

As a further example, if the transmission band of the CC on which the downlink data signal is transmitted is greater than a third reference value, the BS may apply the LDPC coding scheme to the corresponding downlink data signal. On the contrary, if the above condition is not satisfied, the BS may apply the turbo coding scheme to the corresponding downlink data signal. In this case, 6 GHz may be used as the third reference value.

As still another example, if the downlink data signal has a relatively high data rate, the BS may apply the LDPC coding scheme to the corresponding downlink data signal. On the contrary, if the above condition is not satisfied, the BS may apply the turbo coding scheme to the corresponding downlink data signal.

As still a further example, if the downlink data signal has a relatively high coding rate (e.g., 1/2), the BS may apply the LDPC coding scheme to the corresponding downlink data signal. On the contrary, if the above condition is not satisfied (for example, coding rate=1/3), the BS may apply the turbo coding scheme to the corresponding downlink data signal.

The BS may transmit information on the first coding scheme applied to the downlink data signal to the UE. In this case, the information on the first coding scheme may be transmitted via RRC signaling or DCI.

The BS may encode the downlink data signal using the first coding scheme and then transmit the encoded downlink data signal to the UE.

In response to the above-described BS operation, the UE according to the present invention can perform the following operation.

The UE according to the present invention may receive the information on the first coding scheme applied to the downlink data signal from the BS.

Next, the UE may receive, from the BS, the downlink data signal encoded using the first coding scheme.

In addition, the UE may decode the downlink data signal using the first coding scheme. By doing so, the UE can correctly obtain the downlink data signal.

Moreover, the BS according to the present invention can perform the following operation. Specifically, the BS may perform the following operation and the above-described downlink data transmission operation at the same time or perform only the following operation without the downlink data transmission operation.

The BS may determine a second coding scheme to be applied to an uplink data signal that will be received from the UE. In this case, either the turbo coding scheme or LDPC coding scheme may be used as the second coding scheme.

In this case, to determine the second coding scheme, the BS may consider the aforementioned conditions which are considered by the BS to determine the first coding scheme.

The BS may transmit, to the UE, information on the second coding scheme to be applied to the uplink data signal. Next, the BS may receive, from the UE, the uplink data signal encoded using the second coding scheme. In addition, the BS may decode the uplink data signal using the second coding scheme. By doing so, the UE can correctly obtain the downlink data signal.

In response to the above-described BS operation, the UE according to the present invention can perform the following operation.

The UE according to the present invention may receive the information on the second coding scheme to be applied to uplink data signal from the BS. Next, the UE may encode the uplink data signal using the second coding scheme and then transmit the encoded uplink data signal to the BS.

4. Device Configuration

Figure 13:
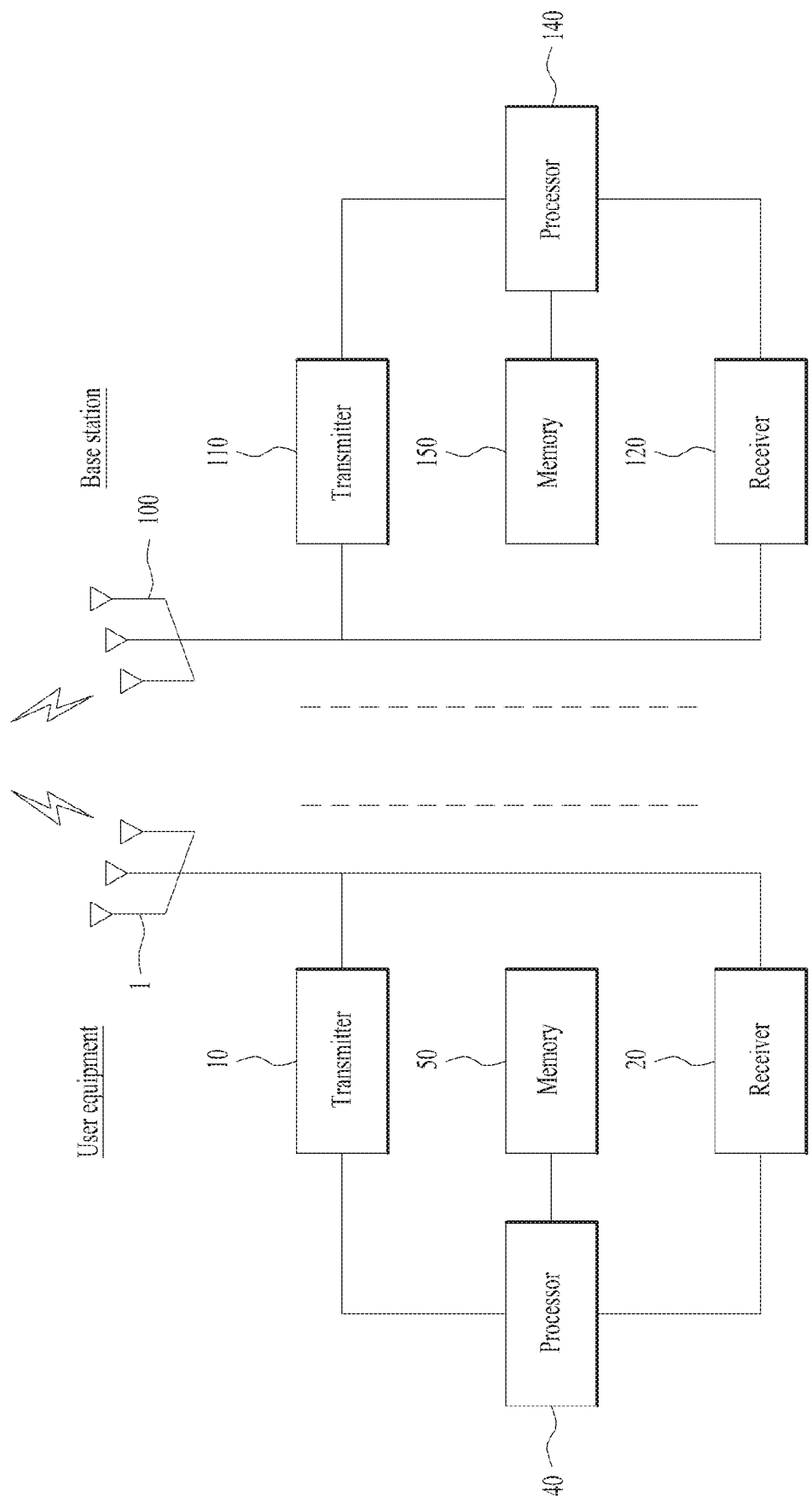
FIG. 13 illustrates the configurations of a UE and a BS for implementing the proposed embodiments.

FIG. 13 is a diagram illustrating configurations of a UE and a BS capable of being implemented by the embodiments proposed in the present invention. The UE and the BS shown in FIG. 13 operate to implement the embodiments of the method for transmitting and receiving a data signal between the UE and the BS.

The UE 1 may act as a transmission end on UL and as a reception end on DL. The BS (eNB) 100 may act as a reception end on UL and as a transmission end on DL.

That is, each of the UE and BS may include a Transmitter (Tx) 10 or 110 and a Receiver (Rx) 20 or 120, for controlling transmission and reception of information, data, and/or messages, and an antenna 30 or 130 for transmitting and receiving information, data, and/or messages.

Each of the UE and BS may further include a processor 40 or 140 for implementing the afore-described embodiments of the present disclosure and a memory 50 or 150 for temporarily or permanently storing operations of the processor 40 or 140.

With the above-described configuration, the BS 100 may be configured to determine a first coding scheme to be applied to a downlink data signal to be transmitted to the UE 1 through the processor 140, transmit information on the first coding scheme to be applied to the downlink data signal to the UE 1 through the transmitter 110, and transmit the downlink data signal, which is encoded using the first coding scheme, to the UE 1. In this case, the BS 100 may determine either a turbo coding scheme or an LDPC coding scheme as the first coding scheme through the processor 140.

In addition, the BS 100 may be configured to determine a second coding scheme to be applied to an uplink data signal that will be received from the UE 1 through the processor 140, transmit information on the second coding scheme to be applied to the uplink data signal to the UE 1 through the transmitter 110, and receive the uplink data signal, which is encoded using the second coding scheme, from the UE 1. In this case, the BS 100 may determine either the turbo coding scheme or LDPC coding scheme as the first coding scheme through the processor 140.

With the above-described configuration, the UE 1 may be configured to receive the information on the first coding scheme to be applied to the downlink data signal from the BS 100 through the receiver 20, receive the downlink data signal, which is encoded using the first coding scheme, from the BS 100, and decode the downlink data signal using the first coding scheme through the processor 40. In this case, either the turbo coding scheme or LDPC coding scheme may be used as the first coding scheme.

In addition, the UE 1 may be configured to receive the information on the second coding scheme to be applied to the uplink data signal from the BS 100 through the receive 10 and transmit the uplink data signal, which is encoded using the second coding scheme, to the BS 100 through the transmitter 20. In this case, either the turbo coding scheme or LDPC coding scheme may be used as the second coding scheme.

The Tx and Rx of the UE and the BS may perform a packet modulation/demodulation function for data transmission, a high-speed packet channel coding function, OFDM packet scheduling, TDD packet scheduling, and/or channelization. Each of the UE and the base station of FIG. 13 may further include a low-power Radio Frequency (RF)/Intermediate Frequency (IF) module.

Meanwhile, the UE may be any of a Personal Digital Assistant (PDA), a cellular phone, a Personal Communication Service (PCS) phone, a Global System for Mobile (GSM) phone, a Wideband Code Division Multiple Access (WCDMA) phone, a Mobile Broadband System (MBS) phone, a hand-held PC, a laptop PC, a smart phone, a Multi Mode-Multi Band (MM-MB) terminal, etc.

The smart phone is a terminal taking the advantages of both a mobile phone and a PDA. It incorporates the functions of a PDA, that is, scheduling and data communications such as fax transmission and reception and Internet connection into a mobile phone. The MB-MM terminal refers to a terminal which has a multi-modem chip built therein and which can operate in any of a mobile Internet system and other mobile communication systems (e.g. CDMA 2000, WCDMA, etc.).

Embodiments of the present disclosure may be achieved by various means, for example, hardware, firmware, software, or a combination thereof.

In a hardware configuration, the methods according to exemplary embodiments of the present disclosure may be achieved by one or more Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, microcontrollers, microprocessors, etc.

In a firmware or software configuration, the methods according to the embodiments of the present disclosure may be implemented in the form of a module, a procedure, a function, etc. performing the above-described functions or operations. A software code may be stored in the memory 50 or 150 and executed by the processor 40 or 140. The memory is located at the interior or exterior of the processor and may transmit and receive data to and from the processor via various known means.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein. It is obvious to those skilled in the art that claims that are not explicitly cited in each other in the appended claims may be presented in combination as an embodiment of the present disclosure or included as a new claim by a subsequent amendment after the application is filed.

INDUSTRIAL APPLICABILITY

The present disclosure is applicable to various wireless access systems including a 3GPP system, and/or a 3GPP2 system. Besides these wireless access systems, the embodiments of the present disclosure are applicable to all technical fields in which the wireless access systems find their applications. Moreover, the proposed method can also be applied to mmWave communication using an ultra-high frequency band.

What is claimed is:

1. A method for transmitting and receiving data signals to and from a User Equipment (UE) by a Base Station (BS) in a wireless communication system, the method comprising:
   receiving, from the UE, first information on a component carrier (CC) on which a downlink data is to be transmitted;
   determining a first coding scheme to be applied to the downlink data signal to be transmitted to the UE based on the first information;

transmitting, to the UE, second information on the first coding scheme to be applied to the downlink data signal; and transmitting, to the UE, the downlink data signal encoded using the first coding scheme, wherein the BS determines either a turbo coding scheme or a Low Density Parity Check (LDPC) coding scheme as the first coding scheme, and wherein the first information includes a number of CCs that the UE can support and a subcarrier spacing applied to the CC.

2. The method of claim 1, wherein the first coding scheme is determined based on a comparison result of the subcarrier spacing applied to the CC with a first reference value, wherein the first coding scheme is determined as the LDPC coding scheme based on that the subcarrier spacing applied to the CC is greater than the first reference value, and wherein the first coding scheme is determined as the turbo coding scheme based on that the subcarrier spacing applied to the CC is less than or equal to the first reference value.

3. The method of claim 1, wherein the first information further includes a transmission bandwidth applied to the CC, and wherein the first coding scheme is determined based on a comparison result of the transmission bandwidth applied to the CC with a second reference value.

4. The method of claim 1, wherein the first information further includes a transmission band of the CC, and wherein the first coding scheme to be applied is determined based on the transmission band of the CC.

5. The method of claim 1, wherein the second information is transmitted through Radio Resource Control (RRC) signaling or Downlink Control Information (DCI).

6. The method of claim 1, further comprising: receiving, from the UE, third information on channel coding schemes that the UE can support, wherein the BS determines the first coding scheme to be applied to the downlink data signal to be transmitted to the UE by additionally using the third information.

7. The method of claim 1, comprising:

determining a second coding scheme to be applied to an uplink data signal to be received from the UE;

transmitting information on the second coding scheme to be applied to the uplink data signal to the UE;

receiving the uplink data signal, which is encoded using the second coding scheme, from the UE; and decoding the uplink data signal using the second coding scheme, wherein the BS determines either the turbo coding scheme or the LDPC coding scheme as the second coding scheme.

8. A method for transmitting and receiving data signals to and from a Base Station (BS) by a User Equipment (UE) in a wireless communication system, the method comprising:

transmitting, to the BS, first information on a component carrier (CC) on which a downlink data is to be transmitted;

receiving, from the BS, second information on a first coding scheme to be applied to a downlink data signal, wherein the first coding scheme is determined based on the first information;

receiving the downlink data signal, which is encoded using the first coding scheme; and decoding the downlink data signal using the first coding scheme, wherein the first coding scheme is either a turbo coding scheme or a Low Density Parity Check (LDPC) coding scheme, and wherein the first information includes a number of CCs that the UE can support and a subcarrier spacing applied to the CC.

9. The method of claim 8, further comprising:

receiving information on a second coding scheme to be applied to an uplink data signal from the BS; and transmitting the uplink data signal, which is encoded using the second coding scheme, to the BS, wherein the second coding scheme is either the turbo coding scheme or the Low Density Parity Check (LDPC) coding scheme.

10. A Base Station (BS) for transmitting and receiving data signals to and from a User Equipment (UE) in a wireless communication system, the BS comprising:

a transmitter;

a receiver; and a processor connected to the transmitter and the receiver, wherein the processor is configured to:

receive, from the UE, first information on a component carrier (CC) on which a downlink data is to be transmitted;

determine a first coding scheme to be applied to the downlink data signal to be transmitted to the UE based on the first information;

transmit, to the UE, second information on the first coding scheme to be applied to the downlink data signal; and transmit, to the UE, the downlink data signal encoded using the first coding scheme, wherein the processor determines either a turbo coding scheme or a Low Density Parity Check (LDPC) coding scheme as the first coding scheme, and wherein the first information includes a number of CCs that the UE can support and a subcarrier spacing applied to the CC.

11. The BS of claim 10, wherein the processor is additionally configured to:

determine a second coding scheme to be applied to an uplink data signal to be received from the UE;

transmit information on the second coding scheme to be applied to the uplink data signal to the UE;

receive the uplink data signal, which is encoded using the second coding scheme, from the UE; and decode the uplink data signal using the second coding scheme, and wherein the processor determines either the turbo coding scheme or the LDPC coding scheme as the second coding scheme.

12. A User Equipment (UE) for transmitting and receiving signals to and from a Base Station (BS) in a wireless communication system, the UE comprising:

a transmitter;

a receiver; and a processor connected to the transmitter and the receiver, wherein the processor is configured to:

transmit, to the BS, first information on a component carrier (CC) on which a downlink data is to be transmitted;

receive, from the BS, second information on a first coding scheme to be applied to the downlink data signal, wherein the first coding scheme is determined based on the first information;

receive, from the BS, the downlink data signal, which is encoded using the first coding scheme; and decode the downlink data signal using the first coding scheme, wherein the first coding scheme is either a turbo coding scheme or a Low Density Parity Check (LDPC) coding scheme, and wherein the first information includes a number of CCs that the UE can support and a subcarrier spacing applied to the CC.

13. The UE of claim 12, wherein the processor is additionally configured to:

receive information on a second coding scheme to be applied to an uplink data signal from the BS; and transmit the uplink data signal, which is encoded using the second coding scheme, to the BS, and wherein the second coding scheme is either the turbo coding scheme or the Low Density Parity Check (LDPC) coding scheme.

* * * * *